United States Patent
Kai et al.

(10) Patent No.: US 9,755,461 B2
(45) Date of Patent: Sep. 5, 2017

(54) NON-CONTACT POWER FEEDING APPARATUS

(71) Applicant: NISSAN MOTOR CO., LTD., Yokohama-shi, Kanagawa (JP)

(72) Inventors: Toshihiro Kai, Yamato (JP); Throngnumchai Kraisorn, Yokohama (JP); Yuuya Yamauchi, Kanagawa (JP); Yuusuke Minagawa, Yokosuka (JP)

(73) Assignee: NISSAN MOTOR CO., LTD., Yokohama-shi (JP)

(*) Notice: Subject to any disclaimer, the term of this patent is extended or adjusted under 35 U.S.C. 154(b) by 0 days.

(21) Appl. No.: 14/417,991

(22) PCT Filed: Jul. 12, 2013

(86) PCT No.: PCT/JP2013/069138
§ 371 (c)(1),
(2) Date: Jan. 28, 2015

(87) PCT Pub. No.: WO2014/021085
PCT Pub. Date: Feb. 6, 2014

(65) Prior Publication Data
US 2015/0171667 A1 Jun. 18, 2015

(30) Foreign Application Priority Data
Jul. 30, 2012 (JP) ................. 2012-168490

(51) Int. Cl.
H01F 27/42 (2006.01)
H01F 37/00 (2006.01)
(Continued)

(52) U.S. Cl.
CPC .............. *H02J 17/00* (2013.01); *G01R 27/32* (2013.01); *H02J 7/025* (2013.01); *H02J 50/10* (2016.02)

(58) Field of Classification Search
CPC . H02J 17/00; H02J 5/005; H02J 7/025; B60L 11/182; H03F 3/24
(Continued)

(56) References Cited

U.S. PATENT DOCUMENTS 8,164,925 B2 4/2012 Abe et al.
8,716,976 B2 5/2014 Kai et al.
(Continued)

FOREIGN PATENT DOCUMENTS

EP 2 348 610 A1 7/2011
EP 2 395 628 A1 12/2011
(Continued)

OTHER PUBLICATIONS

USPTO Notice of Allowance, U.S. Appl. No. 14/347,385, Mar. 10, 2017, 8 pages.

*Primary Examiner* — Rexford Barnie
*Assistant Examiner* — Jagdeep Dhillon
(74) *Attorney, Agent, or Firm* — Foley & Lardner LLP

(57) ABSTRACT

There are provided with: a secondary winding 20 to which an electric power is supplied in a non-contact manner from a primary winding 10 by an alternating-current power source; a first circuit section 21 connected in parallel to the secondary winding 20; and a second circuit section 22 connected in series to a parallel circuit of the secondary winding 20 and the first circuit section 21. An impedance of the first circuit section 21 is larger than an impedance of the second circuit section.

6 Claims, 22 Drawing Sheets

(51) Int. Cl.
*H01F 38/00* (2006.01)
*H02J 17/00* (2006.01)
*G01R 27/32* (2006.01)
*H02J 7/02* (2016.01)
*H02J 50/10* (2016.01)

(58) Field of Classification Search
USPC .... 307/104, 149, 109, 82, 80; 330/296, 297, 330/295; 313/309; 600/561
See application file for complete search history.

(56) References Cited

U.S. PATENT DOCUMENTS

| | | | | |
|---|---|---|---|---|
| 2009/0299216 A1* | 12/2009 | Chen | | A61B 3/16 |
| | | | | 600/561 |
| 2010/0033156 A1 | 2/2010 | Abe et al. | | |
| 2010/0096976 A1* | 4/2010 | Park | | H05B 33/0803 |
| | | | | 313/498 |
| 2011/0316348 A1 | 12/2011 | Kai et al. | | |
| 2012/0043930 A1 | 2/2012 | Scudiere | | |
| 2012/0049791 A1 | 3/2012 | Tanabe | | |
| 2012/0056580 A1 | 3/2012 | Kai et al. | | |
| 2012/0086283 A1* | 4/2012 | Yamamoto | | H02J 17/00 |
| | | | | 307/104 |
| 2012/0319479 A1* | 12/2012 | Covic | | H02J 5/005 |
| | | | | 307/31 |
| 2013/0027078 A1* | 1/2013 | Nakano | | H04B 5/0037 |
| | | | | 324/764.01 |
| 2013/0043737 A1* | 2/2013 | Yeo | | H02J 17/00 |
| | | | | 307/104 |
| 2013/0271222 A1* | 10/2013 | Choi | | H03F 1/565 |
| | | | | 330/295 |
| 2014/0239736 A1 | 8/2014 | Kai et al. | | |
| 2015/0015197 A1* | 1/2015 | Mi | | B60L 11/182 |
| | | | | 320/108 |
| 2015/0171167 A1 | 6/2015 | Nourbakhsh et al. | | |
| 2015/0280445 A1* | 10/2015 | Yamakawa | | H01F 38/14 |
| | | | | 307/104 |

FOREIGN PATENT DOCUMENTS

| | | | | |
|---|---|---|---|---|
| EP | 2 432 098 A1 | | 3/2012 | |
| JP | 2001-238372 A | | 8/2001 | |
| JP | 2010253848 A | * | 11/2010 | ............. H02J 17/00 |
| JP | 2010-288441 A | | 12/2010 | |
| JP | 4644827 B2 | | 3/2011 | |
| JP | 2012-55045 A | | 3/2012 | |
| JP | 2012-120288 A | | 6/2012 | |
| WO | WO-2007/029438 A1 | | 3/2007 | |
| WO | WO-2010/101078 A1 | | 9/2010 | |
| WO | WO-2010/131732 A1 | | 11/2010 | |

* cited by examiner

NON-CONTACT POWER FEEDING APPARATUS

TECHNICAL FIELD

The present invention relates to a non-contact power feeding apparatus.

The present application claims priority from Japanese Patent Application No. 2012-168490 filed on Jul. 30, 2012, and with respect to designated nations where incorporation of a literature by reference is accepted, contents described in the above application are incorporated into the present application by reference, and shall be a part of descriptions of the present application.

BACKGROUND ART

Disclosed is a non-contact power feeding apparatus which is provided with a secondary winding to which an electric power is supplied from an alternating-current power source via a primary winding, and has a capacitor connected in series to a parallel circuit of the secondary winding and a capacitor, and has a characteristic of an impedance ($Z_1$) of the primary side configured to have the maximum value in the vicinity of a frequency of a fundamental wave component of the alternating-current power source, and has a characteristic of an impedance ($Z_2$) of the secondary side configured to have the frequency of the fundamental wave component between a frequency which gives a maximum value and is nearest to the frequency of the fundamental wave component and a frequency which gives a minimum value and is nearest to the frequency of the fundamental wave component (Patent Literature 1).

CITATION LIST

Patent Literature

Patent Literature 1: Japanese Laid-Open Patent Publication No. 2010-288441

SUMMARY OF INVENTION

Technical Problem

However, when a magnitude of an impedance of a resonant circuit of a secondary winding and a capacitor connected in parallel to the secondary winding is small, there has been a problem that within an electric current which flows into the secondary winding, an electric current which flows into a load side becomes small, and an output power becomes small.

A problem to be solved by the present invention is to provide a non-contact power feeding apparatus which increases an output power.

Solution to Problem

The present invention includes: a first circuit section connected in parallel to a secondary winding to which an electric power is supplied in a non-contact manner; and a second circuit section connected in series to a parallel circuit of the secondary winding and the first circuit section, wherein an impedance of the first circuit section is made larger than an impedance of the second circuit section, and thereby, the problem mentioned above is solved.

Advantageous Effects of Invention

According to the present invention, since an impedance of the first circuit section becomes larger than an impedance of the second circuit section, an electric current which flows into a load side from the secondary winding can be increased. Therefore, an effect that an output power of the non-contact power feeding apparatus can be increased is achieved.

Figure 1:
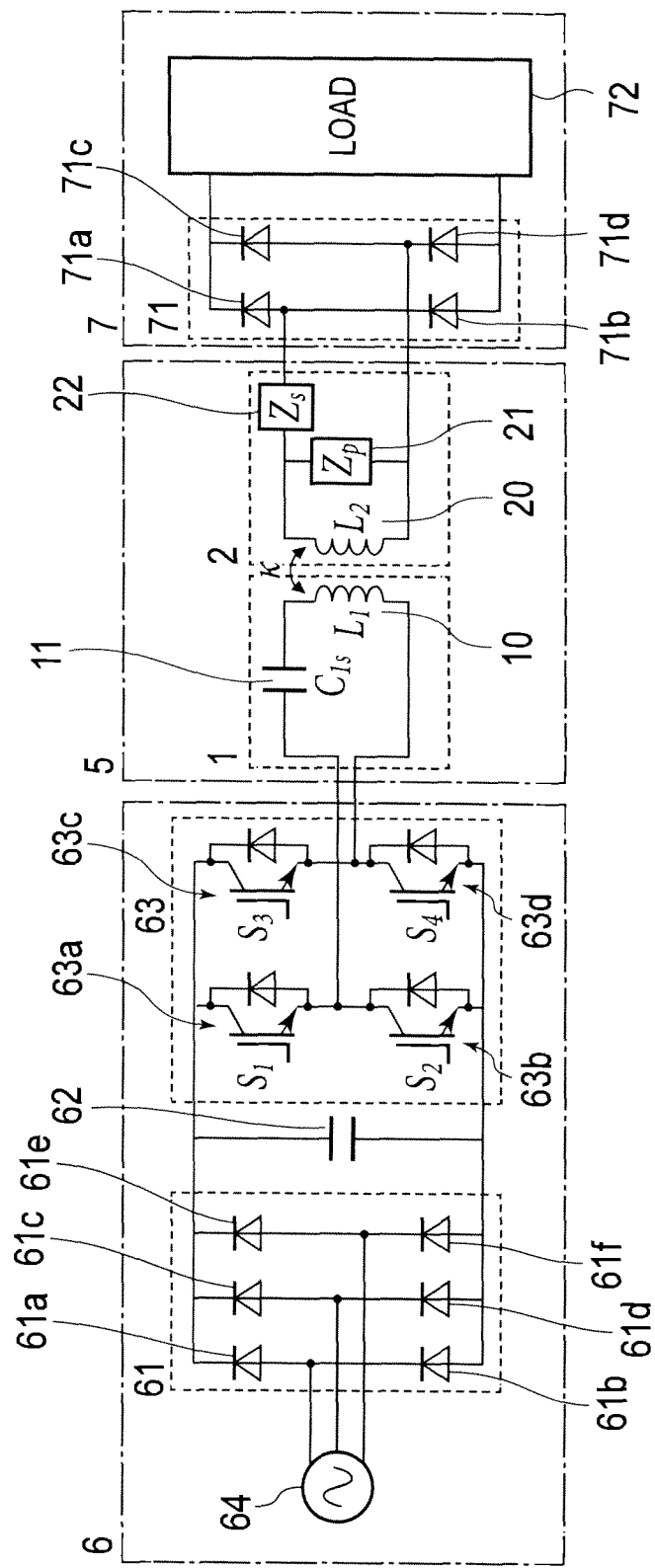
FIG. 1 illustrates an electric circuit diagram of a non-contact power feeding apparatus according to an embodiment of the present invention.
Figure 6:
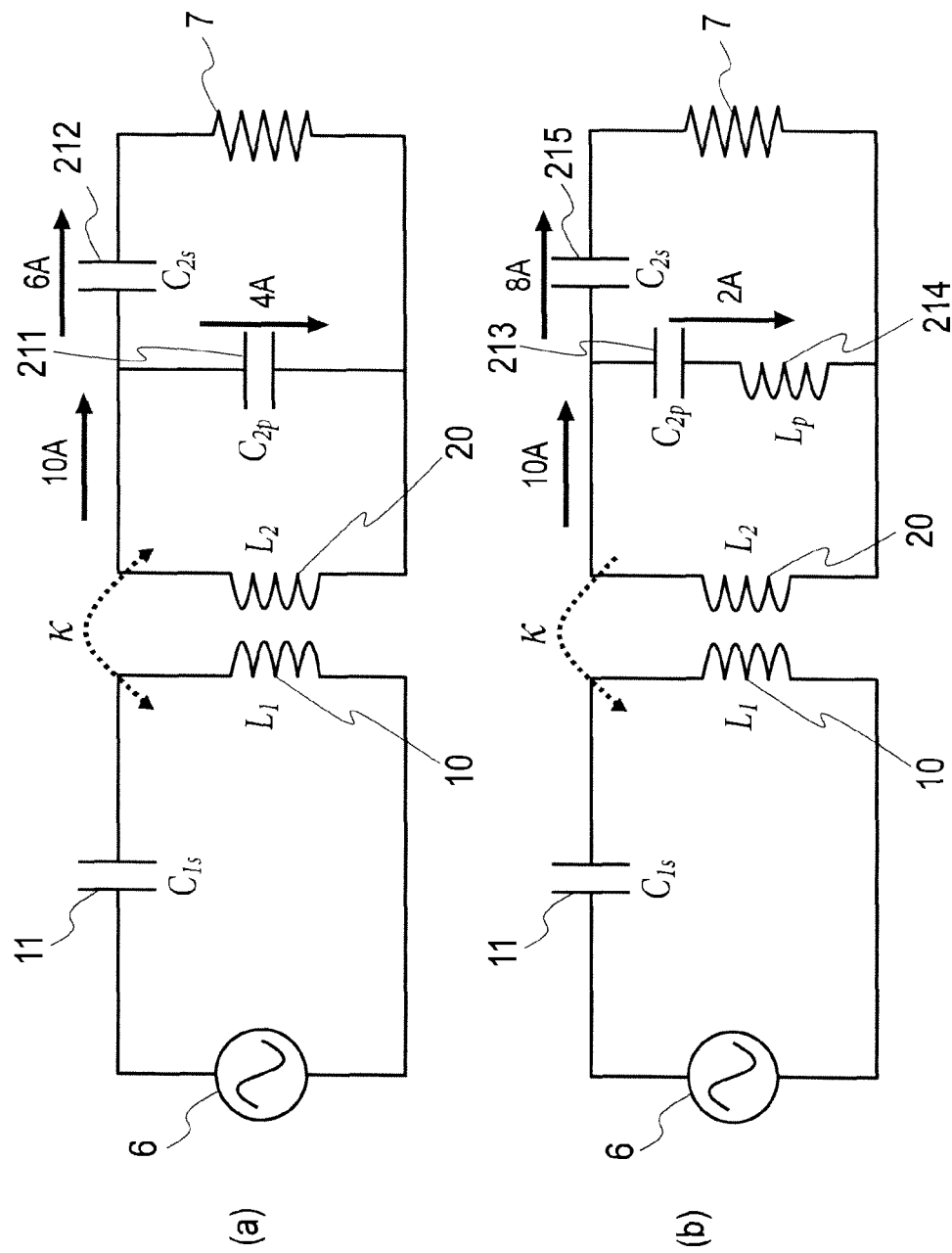

FIGS. 6(a) and 6(b) illustrate circuit diagrams for describing a magnitude of an electric current, in which FIG. 6(a) illustrates a circuit diagram of a non-contact power feeding apparatus according to the comparative example, and FIG. 6(b) illustrates a circuit diagram of the non-contact power feeding apparatus of FIG. 1.

Figure 7:
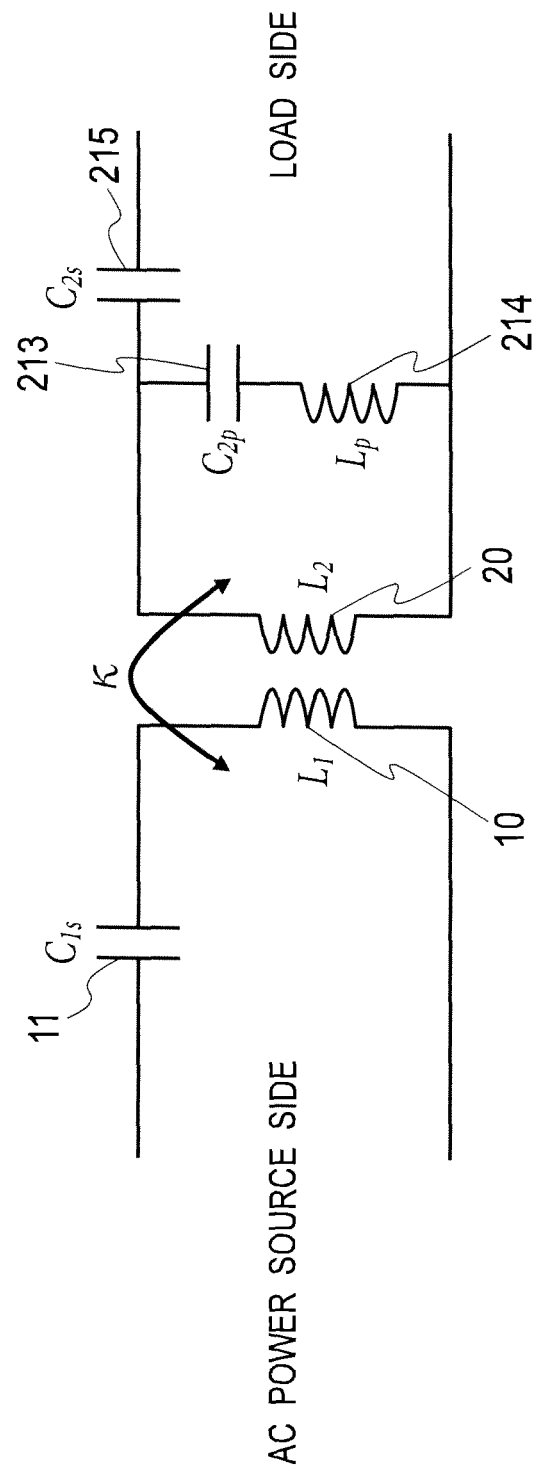

FIG. 7 illustrates a circuit diagram of the non-contact power feeding section of FIG. 1.

Figure 8:
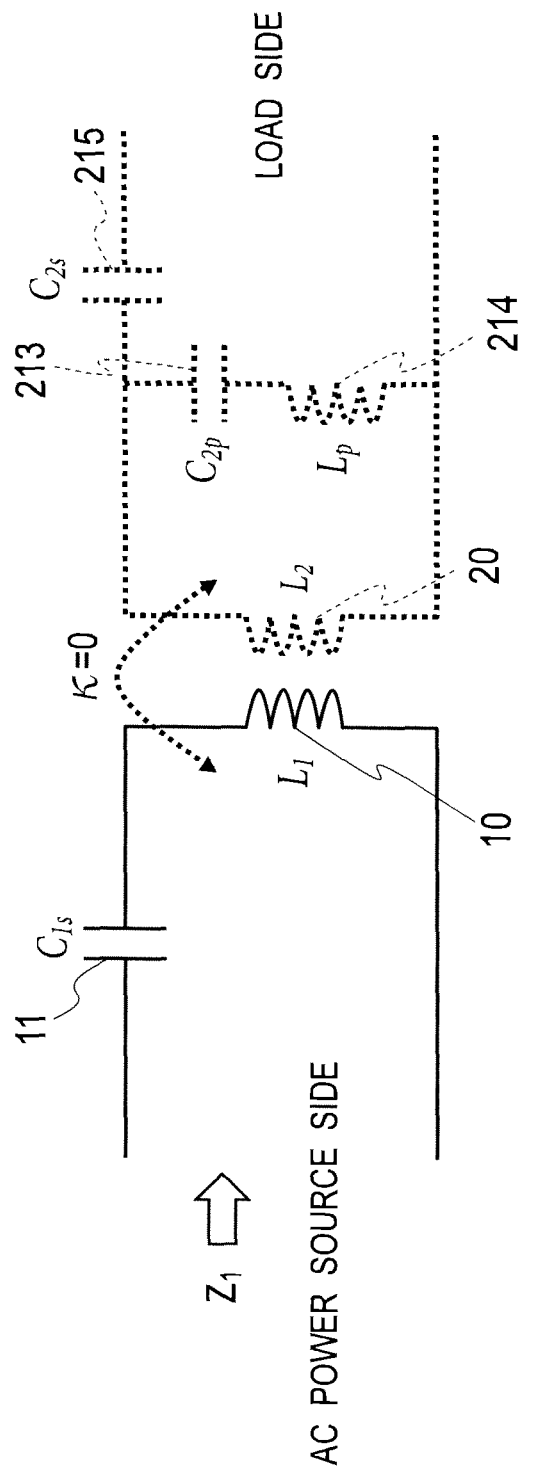

FIG. 8 illustrates a circuit diagram for describing an impedance ($Z_1$) of only a primary side.

Figure 9:
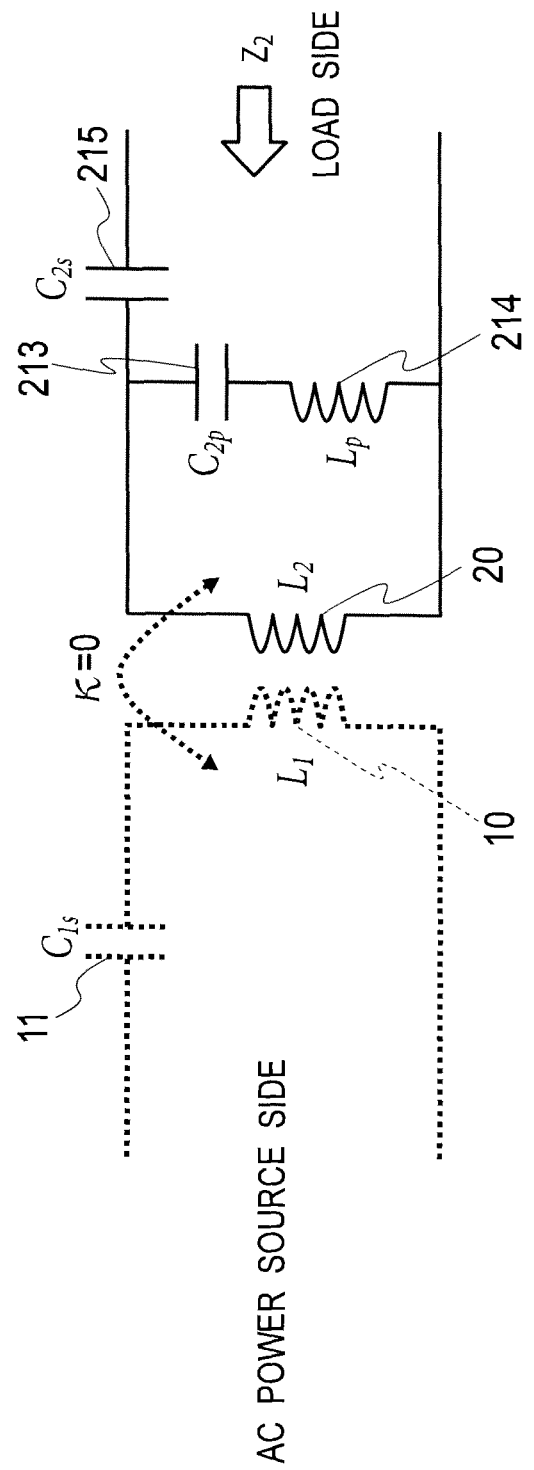

FIG. 9 illustrates a circuit diagram for describing an impedance ($Z_2$) of only a secondary side.

Figure 10:
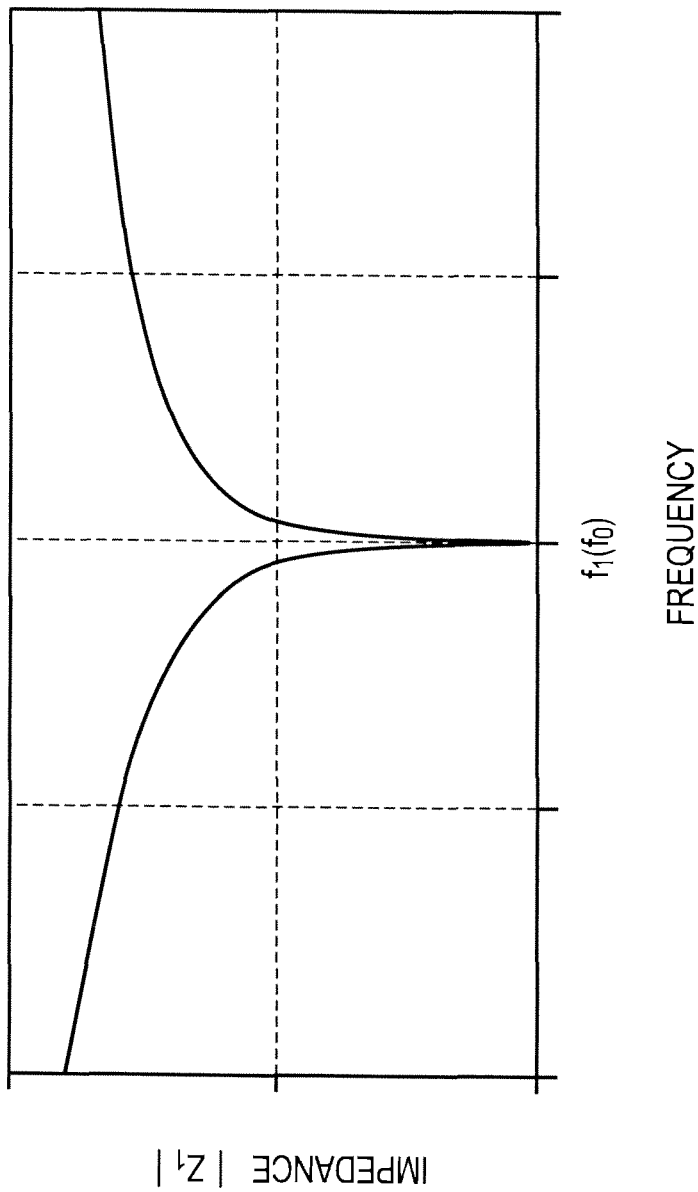

FIG. 10 is a graph illustrating a frequency-impedance ($Z_1$) characteristic in the circuit of FIG. 8.

Figure 11:
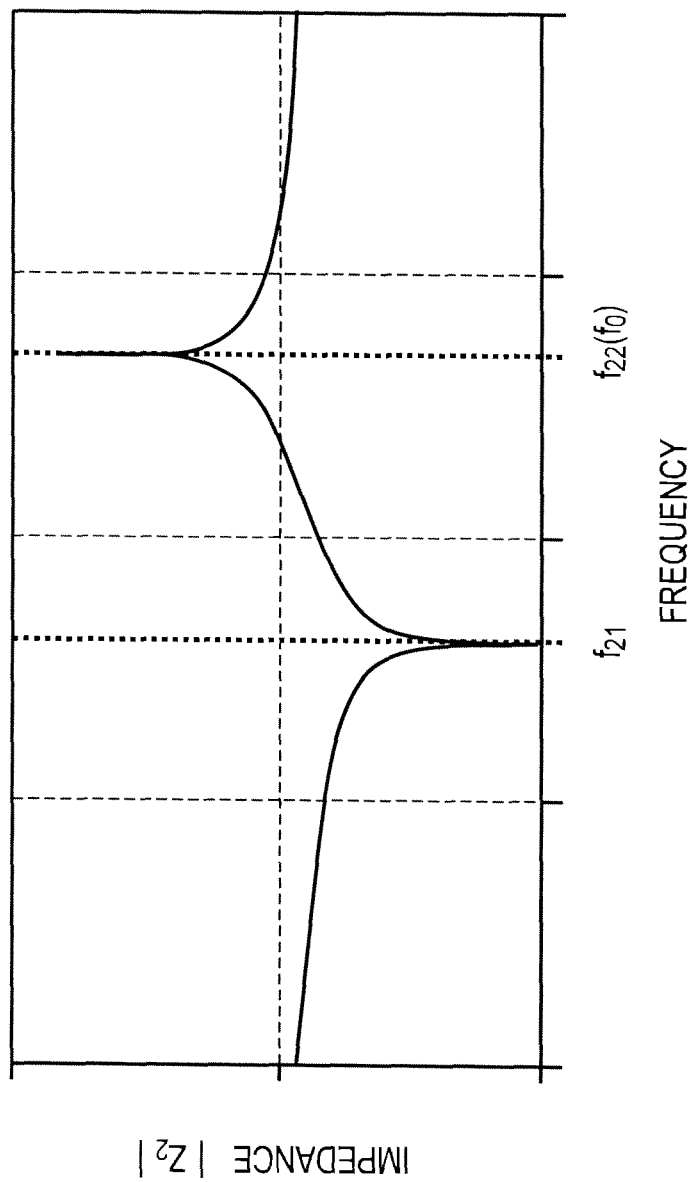

FIG. 11 is a graph illustrating a frequency-impedance ($Z_2$) characteristic in the circuit of FIG. 9.

Figure 12:
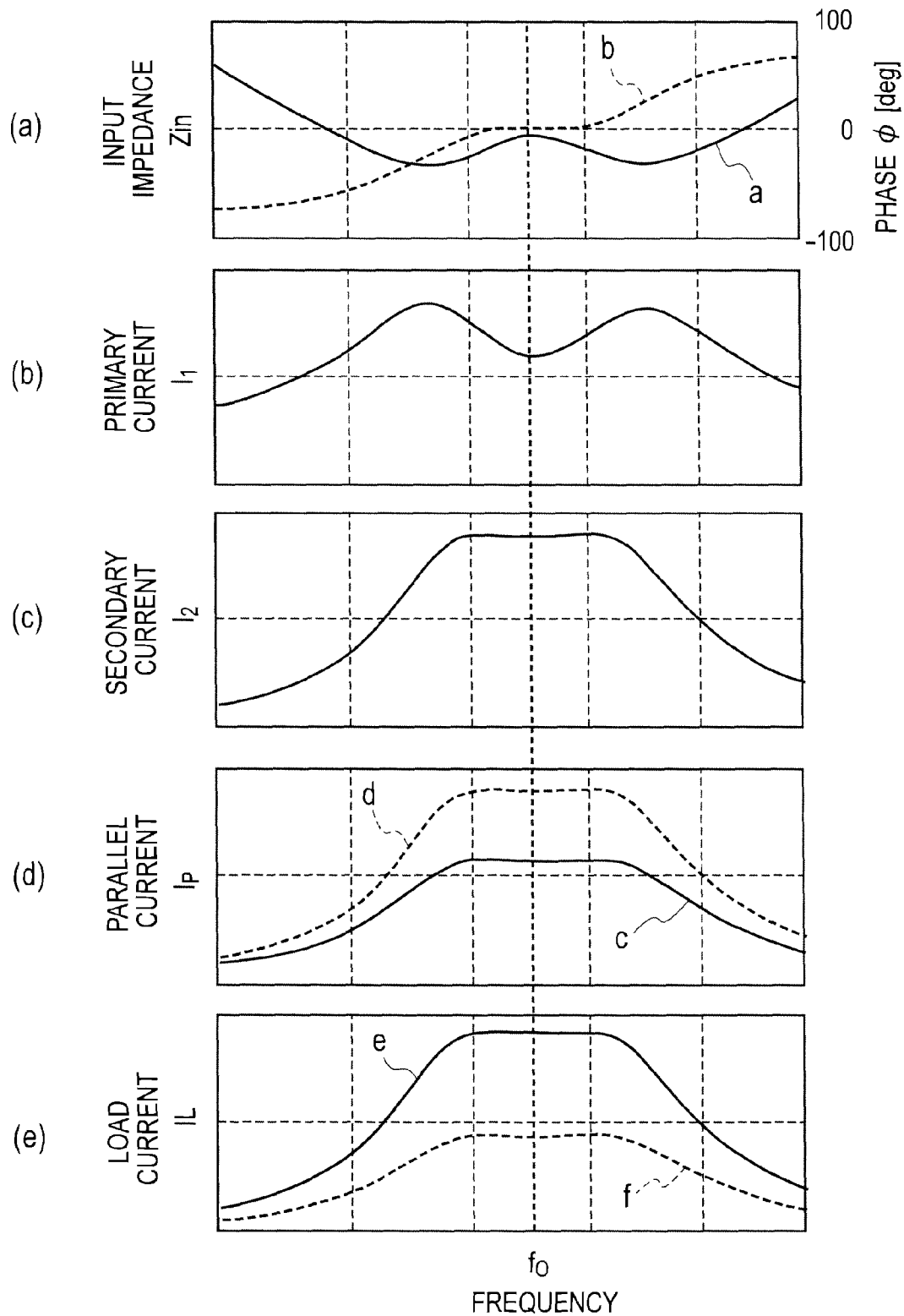

FIG. 12(a) is a graph illustrating an absolute value characteristic and a phase ($\phi$) characteristic of an input impedance ($Z_{in}$) of the non-contact power feeding section of FIG. 1, FIG. 12(b) is a graph illustrating a frequency characteristic of an electric current ($I_1$) of a primary winding of FIG. 7, FIG. 12(c) is a graph illustrating a frequency characteristic of an electric current ($I_2$) of a secondary winding, FIG. 12(d) is a graph illustrating a frequency characteristic of an electric current which flows through a capacitor and coil connected in parallel to the secondary winding of FIG. 7, and FIG. 12(e) is a graph illustrating a frequency characteristic of an electric current which flows into a load side of FIG. 7.

Figure 13:
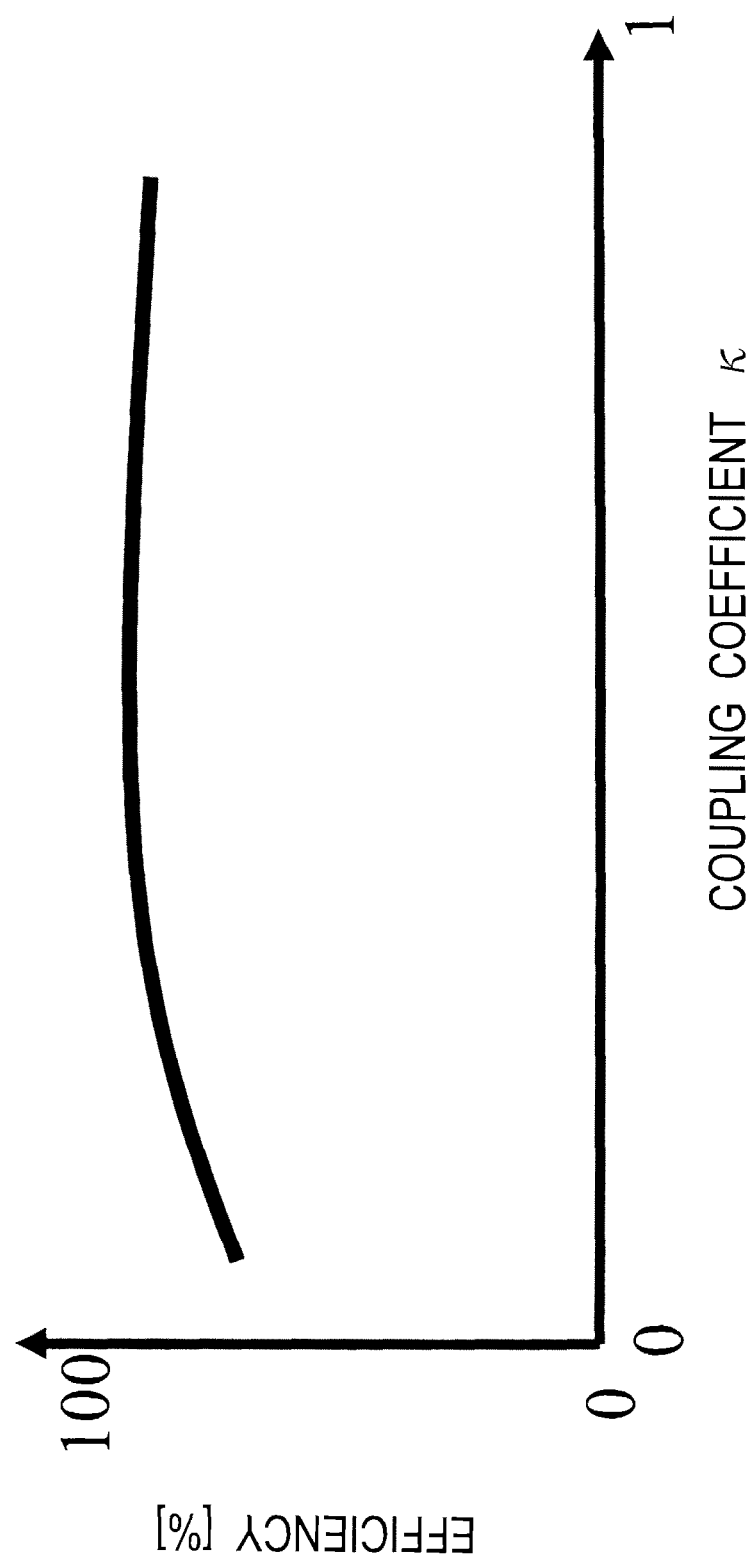

FIG. 13 is a graph illustrating a characteristic of a feeding efficiency with respect to a coupling coefficient in the non-contact power feeding apparatus of FIG. 1.

Figure 14:
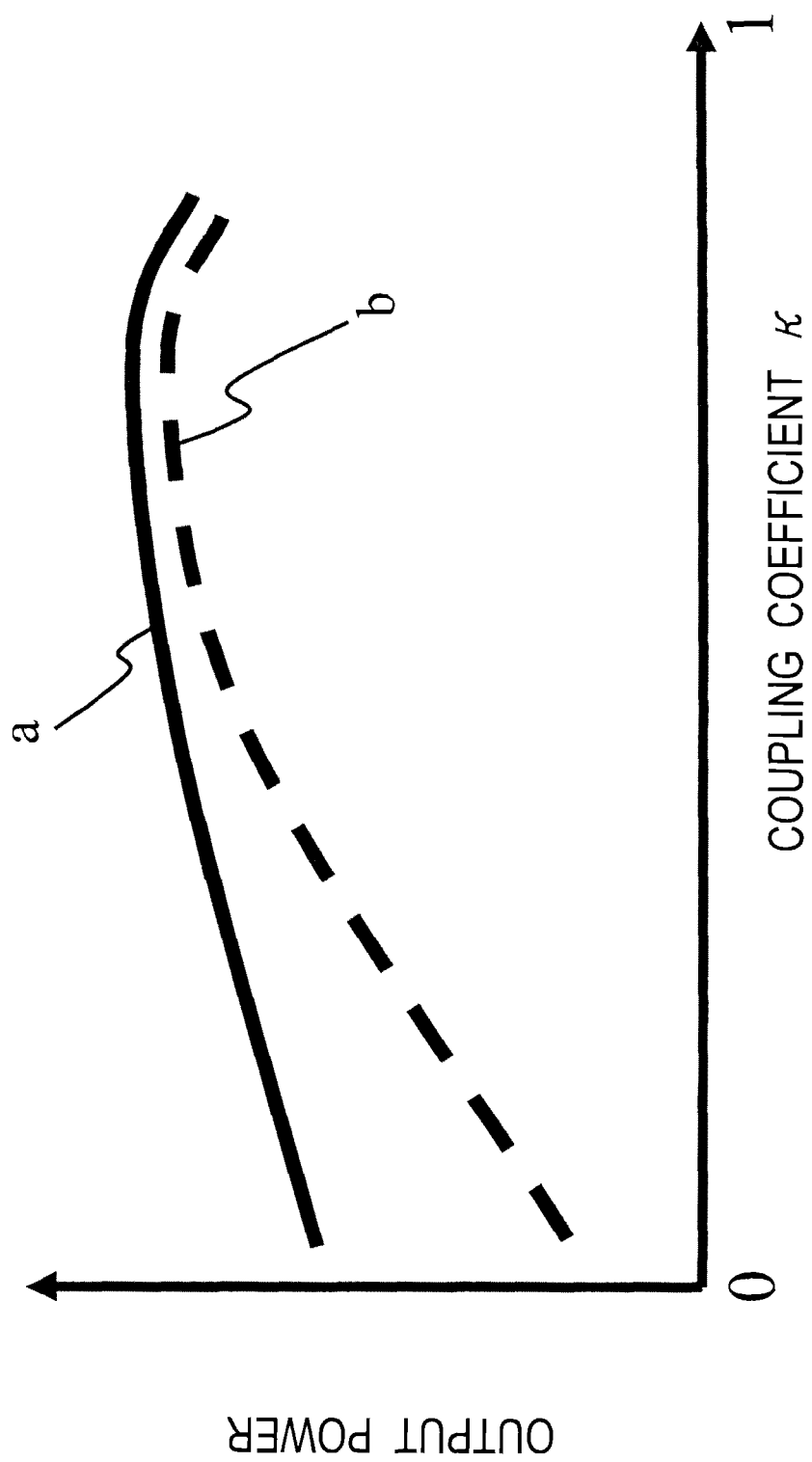

FIG. 14 is a graph illustrating a characteristic of an output power with respect to a coupling coefficient in the non-contact power feeding apparatus of FIG. 1.

Figure 15:
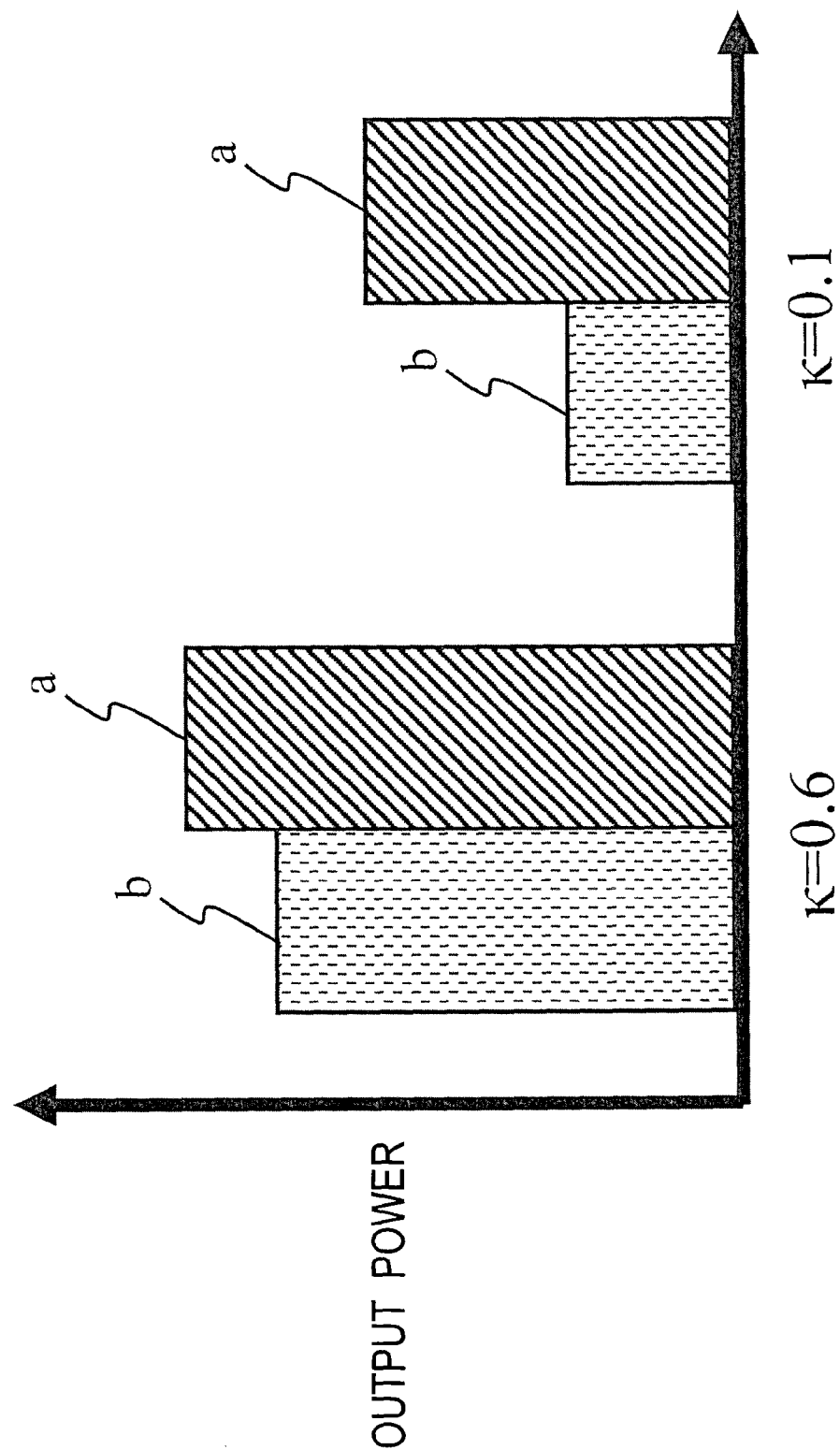

FIG. 15 is a graph illustrating a magnitude of an output power when a coupling coefficient ($\kappa$) is set to 0.1 and 0.6.

Figure 16:
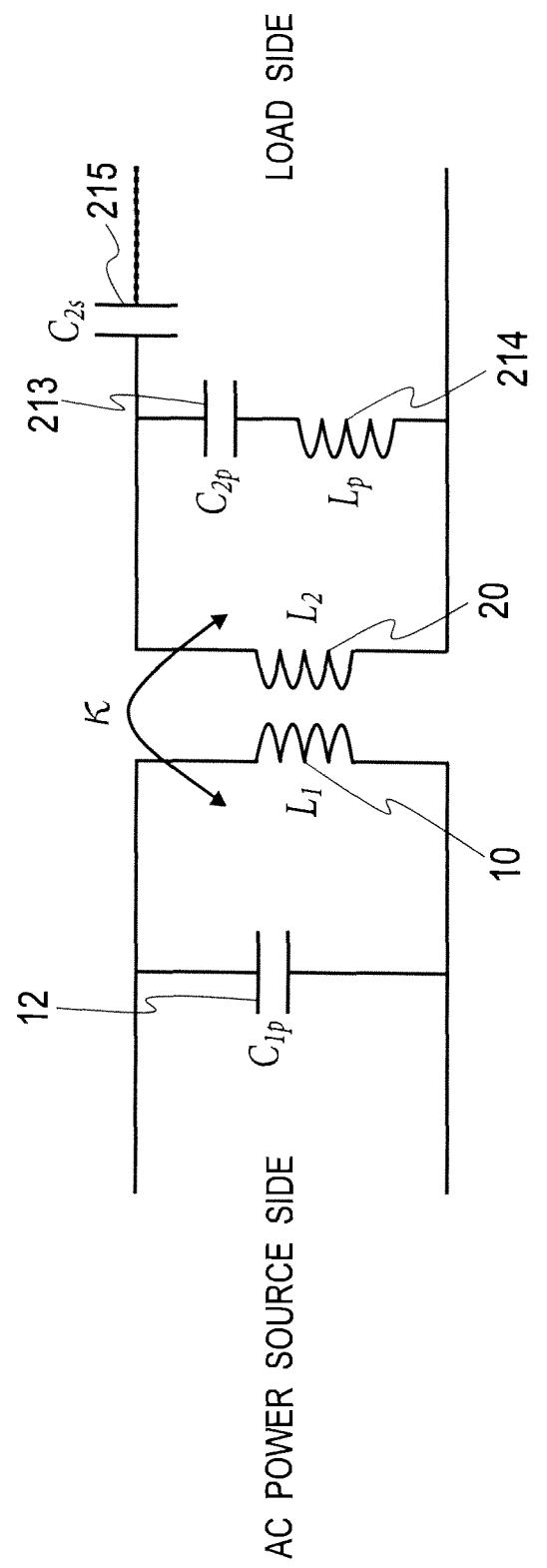

FIG. 16 illustrates a circuit diagram of a non-contact power feeding section according to a modification example of the present invention.

Figure 17:
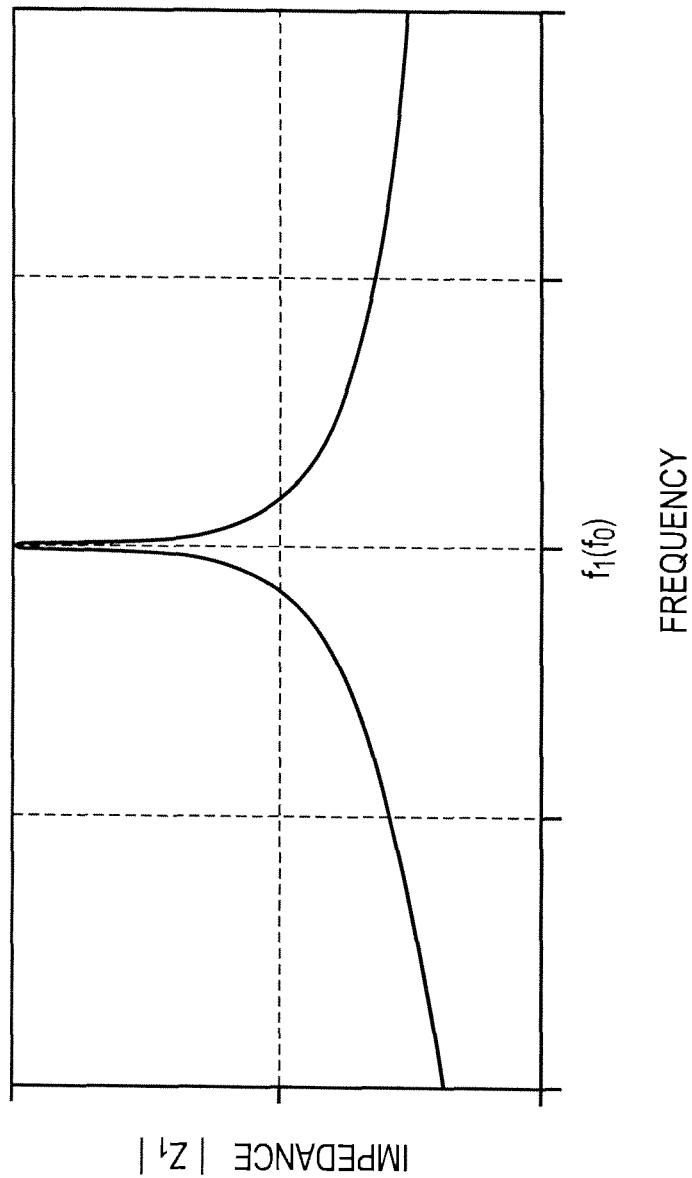

FIG. 17 is a graph illustrating a frequency-impedance ($Z_1$) characteristic in the circuit of FIG. 16.

Figure 18:
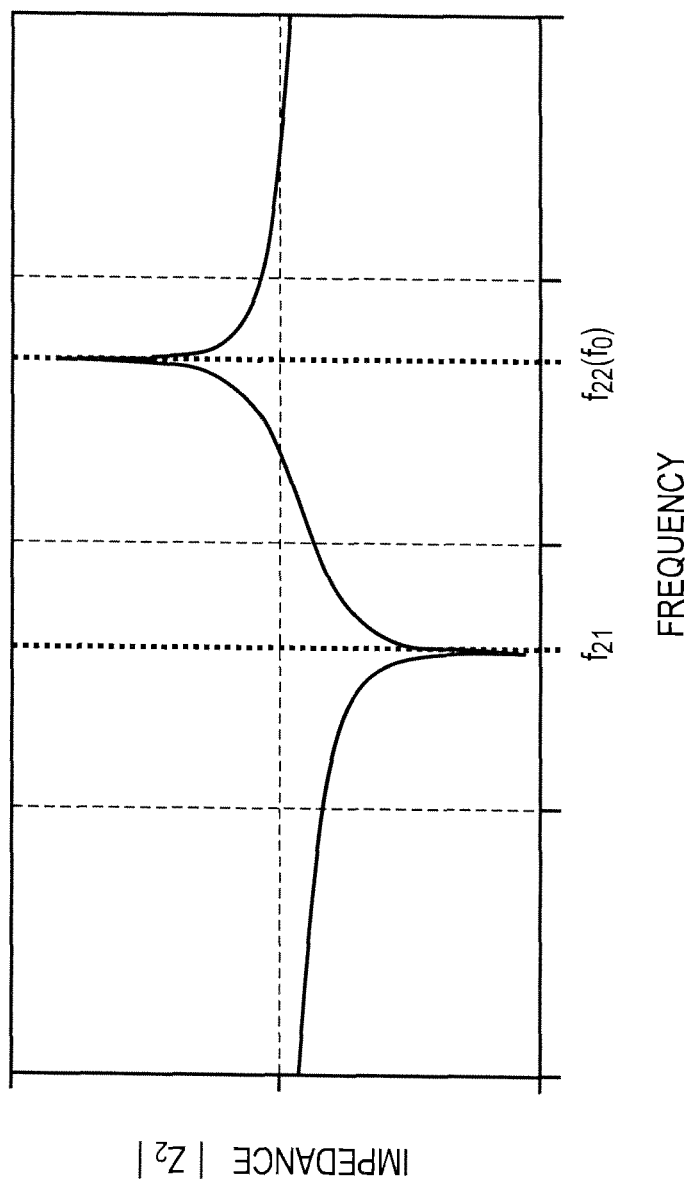

FIG. 18 is a graph illustrating a frequency-impedance ($Z_2$) characteristic in the circuit of FIG. 16.

Figure 19:
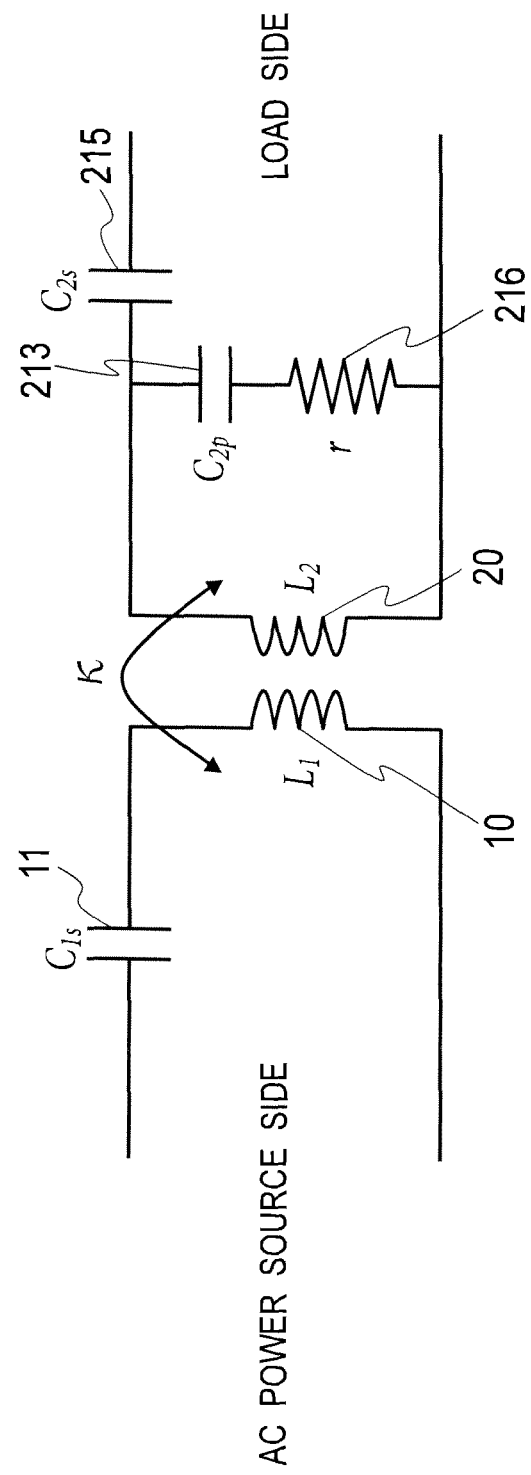

FIG. 19 illustrates a circuit diagram of a non-contact power feeding section according to a modification example of the present invention.

Figure 20:
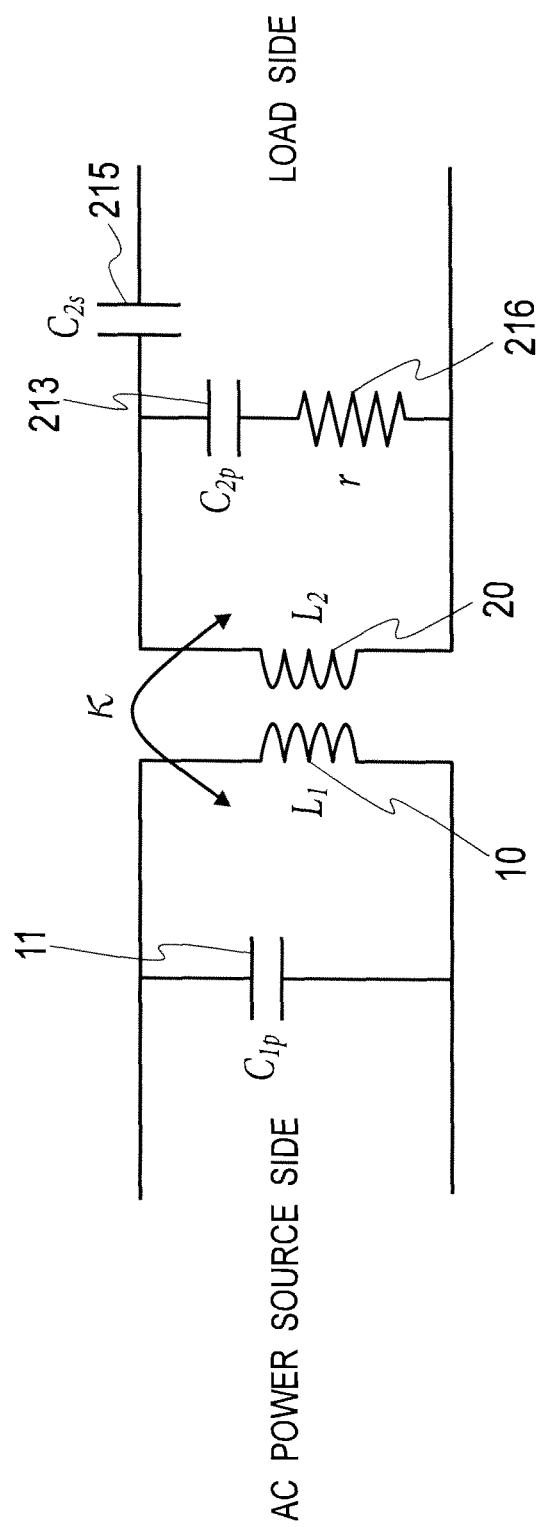

FIG. 20 illustrates a circuit diagram of a non-contact power feeding section according to a modification example of the present invention.

Figure 21:
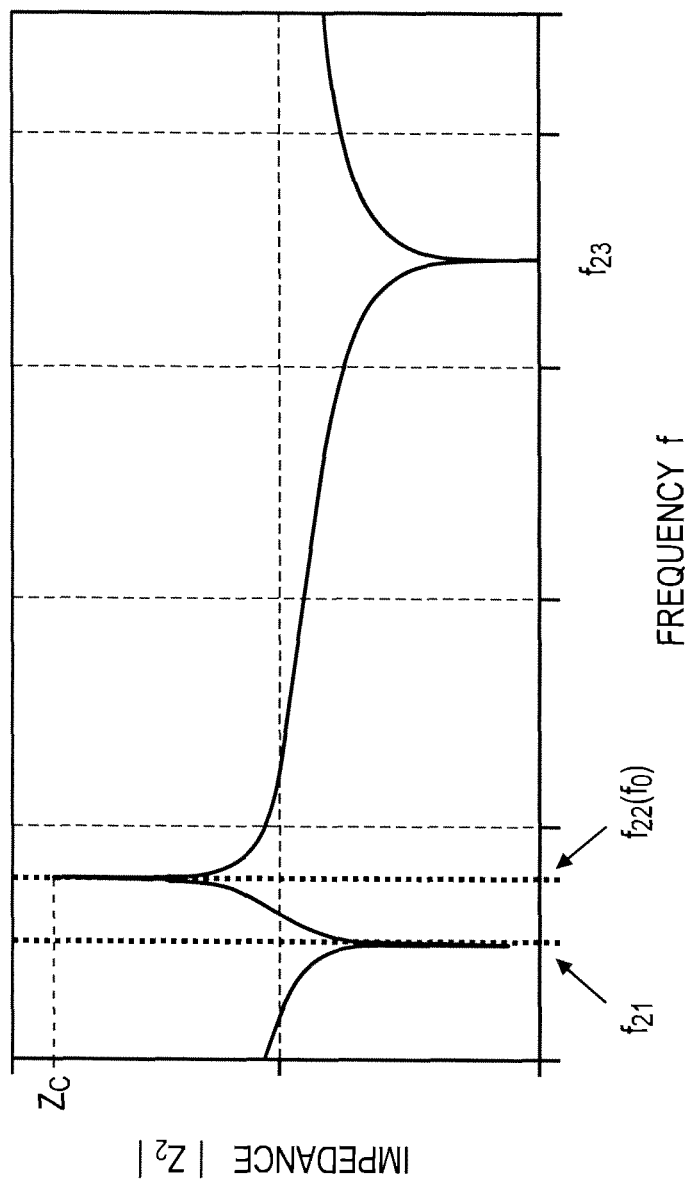

FIG. 21 is a graph illustrating a frequency-impedance ($Z_2$) characteristic in a non-contact power feeding section according to another embodiment of the present invention.

DESCRIPTION OF EMBODIMENTS

Hereinafter, embodiments of the present invention will be described based on drawings.

First Embodiment

As an example of a non-contact power circuit apparatus according to an embodiment of the invention, a non-contact power feeding apparatus used together with a battery for vehicles and power load of an electric vehicle etc. will be described.

FIG. 1 illustrates an electric circuit diagram of the non-contact power feeding apparatus. The non-contact power feeding apparatus according to the present embodiment includes: a high frequency alternating-current power source section 6; a non-contact power feeding section 5 which performs non-contact power feeding of an electric power outputted from the high frequency alternating-current power source circuit 6; and a load section 7 to which an electric power is supplied by the non-contact power feeding section 5.

The high frequency alternating-current power source section 6 is provided with: a three-phase alternating-current power source 64; a rectifier 61 which is connected to the three-phase alternating-current power source 64, and rectifies a three-phase alternating current into a direct current; and a voltage type inverter 63 which is connected to the rectifier 61 via a smoothing capacitor 62, and converts the rectified electric current into a high frequency power. The rectifier 61 has a diode 61a and diode 61b, a diode 61c and diode 61d, and a diode 61e and diode 61f connected in 3-parallel, and connects an output of the three-phase alternating-current power source 64 to each intermediate connection point. The voltage type inverter 63 has a series circuit of a switching element 63a where a diode is connected to a MOSFET power transistor etc. in reverse parallel and a similar switching element 63b, and a series circuit of a similar switching element 63c and switching element 63d, connected in parallel, and is connected to the rectifier 61 via a smoothing capacitor 62. Then, the intermediate connection point between the switching element 63a and switching element 63b and the intermediate connection point between the switching element 63c and switching element 63d are each connected to a power transmission circuit section 1 which is a primary side of the non-contact power feeding section 5. The voltage type inverter 63 supplies an alternating current power of approximately several kHz to several hundreds kHz to the non-contact power feeding section 5.

Here, an output waveform outputted to the non-contact power feeding section 5 from the high frequency alternating-current power source section 6 is a waveform which changes periodically, and a frequency of the output waveform is assumed to be f0. In addition, when a distortion is included in the output waveform (or when the output waveform is a square wave, for example), a frequency of a fundamental sine wave (fundamental wave) included in a periodic function of the waveform including a distortion becomes the frequency ($f_0$). In addition, the frequency ($f_0$) is also a drive frequency of the high frequency alternating-current power source section 6. Hereinafter, in the present invention, these frequencies are generically referred to as a frequency ($f_0$) of a fundamental wave component of the high frequency alternating-current power source section 6. Note that, a power factor improvement circuit (PFC) may be connected after the rectifier 61, and a DC/DC converter etc. may be provided after the rectifier 61 and electric power adjustment may be carried out. In addition, the high frequency alternating-current power source section 6 is not necessarily a circuit illustrated in FIG. 1, and may be another circuit.

The non-contact power feeding section 5 has a power transmission circuit 1 which is an input side (primary side) of a transformer, and a power reception circuit section 2 which is an output side (secondary side) of the transformer. The power transmission circuit section 1 is provided with a primary winding 10, and a capacitor 11 connected in series to the primary winding 10. The power reception circuit section 2 is provided with: a secondary winding 20; a first circuit section 21 connected in parallel to the secondary winding 20; and a second circuit section 22 connected in series to a parallel circuit of the secondary winding 20 and the first circuit section 21. Note that, a specific configuration of the first circuit section 21 and the second circuit section 22 is mentioned later.

The load section 7 has a rectifying section 71 which rectifies an alternating current power supplied from the non-contact power feeding section 5 into a direct current, and a load 72 connected to the rectifying section 71. The rectifying section 71 has a diode 71a and diode 71b, and a diode 71c and diode 71d connected in parallel, and connects an output of power reception circuit section 2 to each intermediate connection point. Then, an output of the rectifying section 71 is connected to the load 72.

Next, using FIG. 2a, FIG. 2b and FIG. 3, when the non-contact power circuit apparatus illustrated in FIG. 1 is installed on a vehicle and at a parking lot, a coupling coefficient (κ) between the primary winding 10 and the secondary winding 20 will be described.

In the present example, the power reception circuit section 2 including the secondary winding 20 and the load section 7 are installed on e.g. a vehicle, and the power transmission circuit section 1 including the primary winding 10 and the high frequency alternating-current power source 6 are installed at, e.g. a parking lot as a ground side. In the case of an electric vehicle, the load 72 corresponds to, e.g. a secondary battery. The secondary winding 20 is mounted on, e.g. a chassis of a vehicle. Then, a driver of a vehicle parks the vehicle at the parking lot so that the secondary winding 20 may be located over the primary winding 10, an electric power is supplied to the secondary winding 20 from the primary winding 10, and the secondary battery included in the load 72 is charged.

Figure 2A:
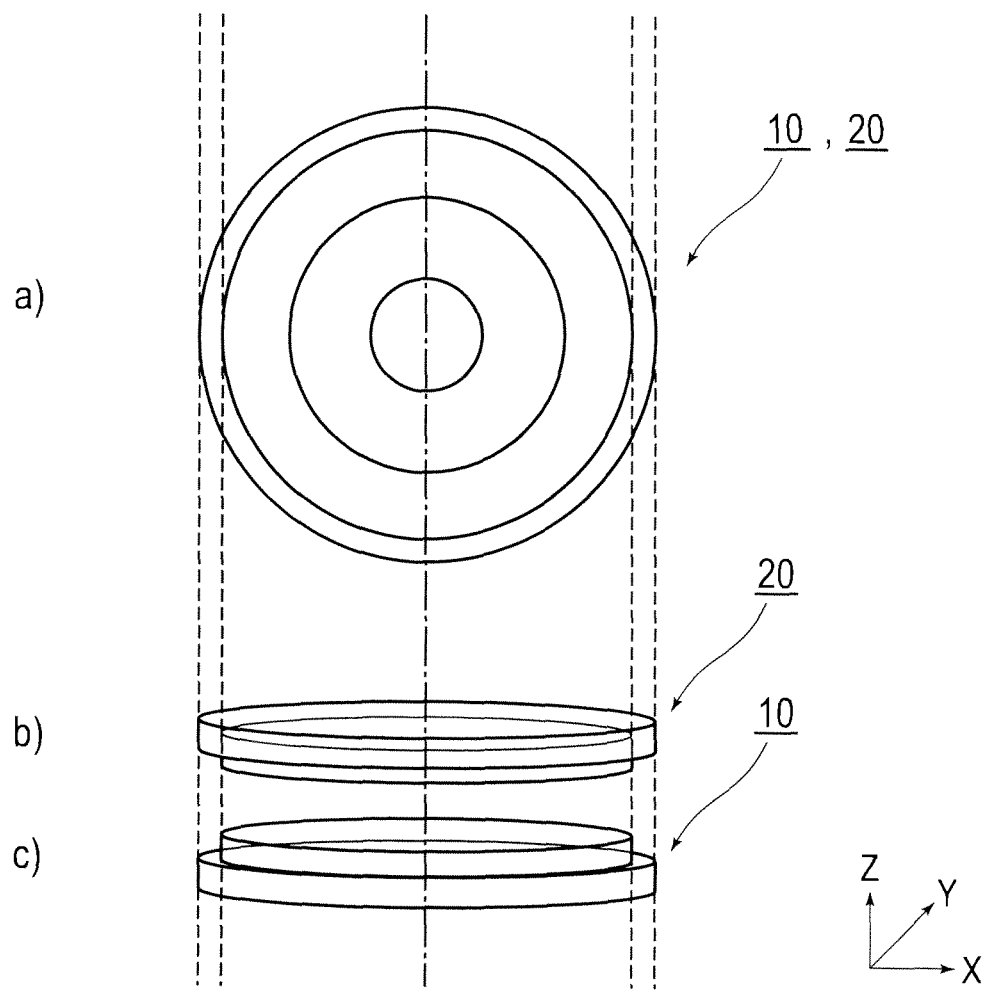
FIG. 2a is a plan view and perspective view illustrating a state where a primary winding and a secondary winding of FIG. 1 are opposed.

Each of FIG. 2a and FIG. 2h includes a plan view a), and perspective views b) and c) illustrating a state where the primary winding 10 and the secondary winding 20 are opposed. In FIG. 2a and FIG. 2b, the X-axis and Y-axis indicate a plane direction of the primary winding 10 and secondary winding 20, and the Z-axis indicates a height direction. Note that, for the present description, both the primary winding 10 and secondary winding 20 are made to have the same circular shape, but, the present example is not necessarily circular, and also the shapes of the primary winding 10 and secondary winding 20 are not necessarily the same.

Figure 2B:
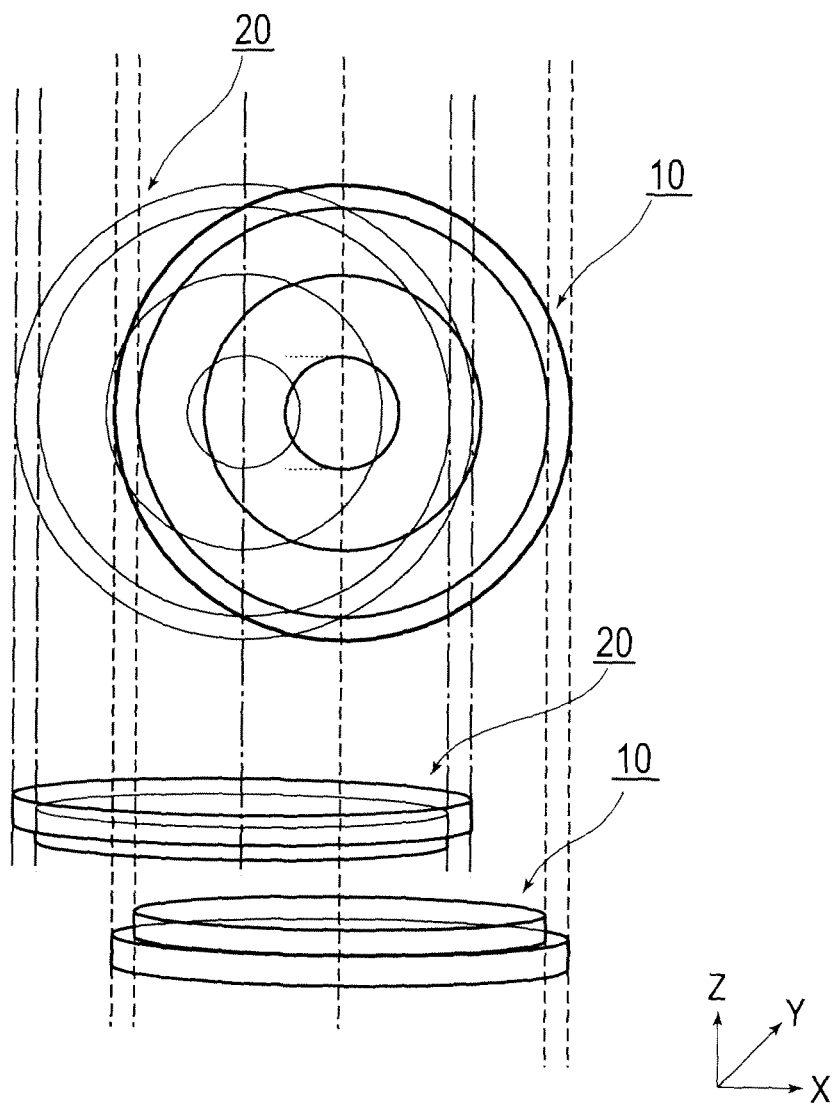
FIG. 2b is a plan view and perspective view illustrating a state where the primary winding and the secondary winding of FIG. 1 are opposed, and illustrating a case where the above state is shifted in an X-axis direction.

Now, as illustrated in FIG. 2a, in the X-axis and Y-axis directions which are a plane direction, when a vehicle is parked at a parking lot so that the secondary winding 20 may be matched with the primary winding 10, there is no problem, but, depending on a driver's skill, as illustrated in FIG. 2b, a relative position between the primary winding 10 and secondary winding 20 may be deviated in a plane direction. In addition, since a height of a vehicle changes depending on a vehicle type and a loading weight, a distance in a height direction Z between the primary winding 10 and secondary winding 20 changes also depending on a vehicle height.

When an electric power supplied to the primary winding 10 from the high frequency alternating-current power source 6 is made constant, an efficiency of an electric power received by the secondary winding 20 is the highest in a state where the secondary winding 20 is matched with the primary winding 10 (corresponding to a state of FIG. 2a), and will become low when the central point of the secondary winding 20 becomes far from the central point of primary winding 10.

Figure 3:
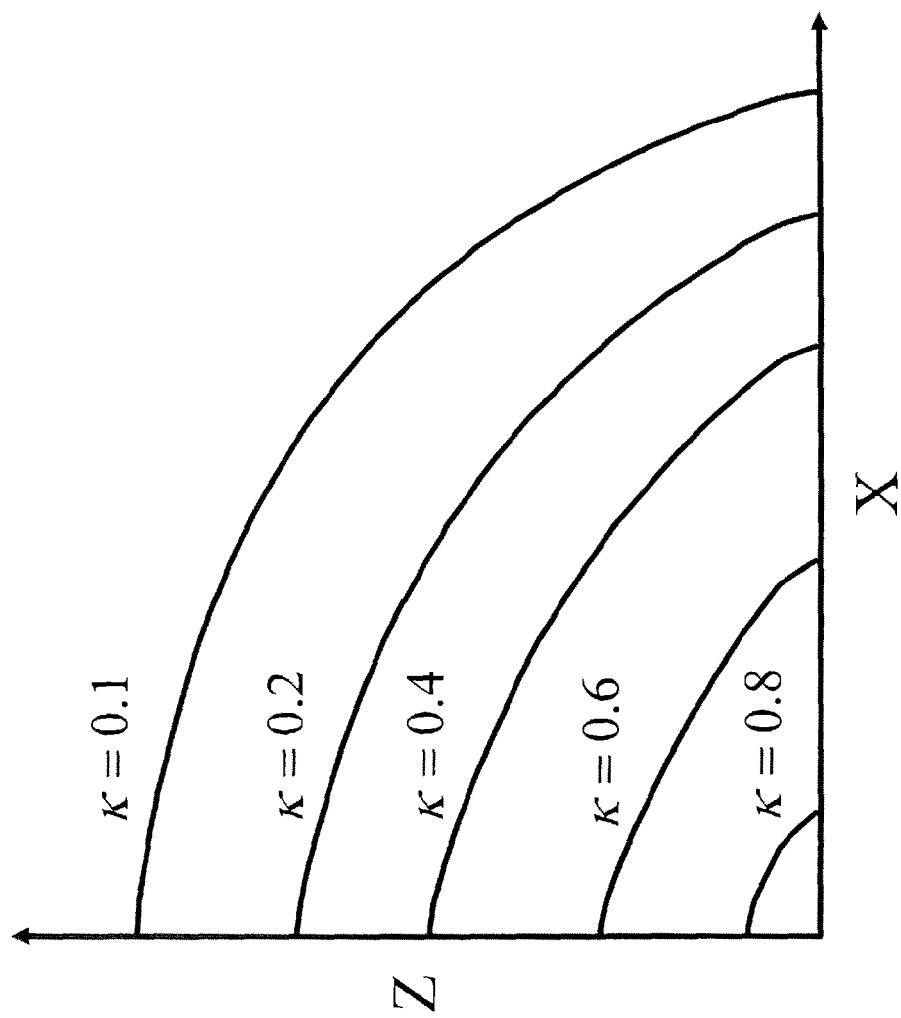
FIG. 3 is a graph illustrating a change of a coupling coefficient with respect to the secondary winding in an X-axis direction (Y-axis direction) and a Z-axis direction which are illustrated in FIGS. 2a and 2b.

FIG. 3 illustrates a change of a coupling coefficient with respect to the secondary winding 20 in an X-axis direction (Y-axis direction) and Z-axial direction indicated in FIGS. 2a and 2b. As illustrated in FIG. 3, when a center of the primary winding 10 and a center of the secondary winding 20 are matched with each other, a leakage flux between the primary winding 10 and secondary winding 20 is little and a value of the X-axis of FIG. 3 corresponds to zero, and a coupling coefficient κ becomes large. On the other hand, as illustrated in FIG. 2b against FIG. 2a, when positions of the primary winding 10 and secondary winding 20 are deviated in an X-axis direction, a leakage flux increases, and as illustrated in FIG. 3, a coupling coefficient κ becomes small. In addition, when a deviation in a Z-axis (height) direction of the primary winding 10 and secondary winding 20 becomes large, a coupling coefficient κ becomes small.

Figure 4:
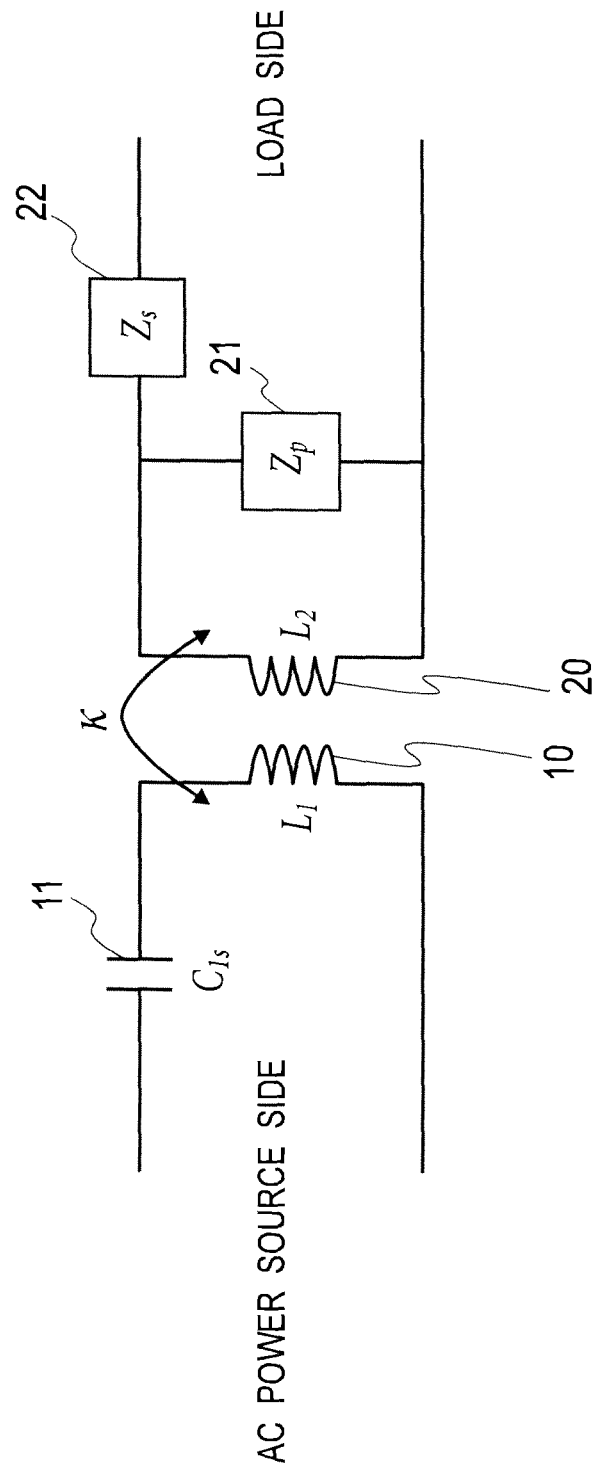
FIG. 4 illustrates a circuit diagram of a non-contact power feeding section 5 of FIG. 1.

Next, using FIGS. 4, 5(a) and 5(b), a circuit configuration of the non-contact power feeding section 5 will be described. FIG. 4 illustrates a circuit diagram of the non-contact power feeding section 5 of FIG. 1. In FIG. 4, an input side (high frequency alternating-current power source section 6 side) of the power transmission circuit section 1 is indicated as an "alternating-current power source side", and an output side (load section 7 side) of the power reception circuit section 2 is indicated as a "load side". The same indication is carried out similarly in other figures.

As illustrated in FIG. 4, an impedance of a first circuit section 21 connected in parallel to the secondary winding 20 is assumed to be 4, and an impedance of the second circuit element connected in series to a parallel circuit of the secondary winding 20 and first circuit section 21 is assumed to be $Z_s$. The first circuit section 21 forms a resonant circuit with the secondary winding 20, and the second circuit section 22 forms a resonant circuit with the secondary winding 20 at least which is different from the resonant circuit including the first circuit section 21. That is, the power reception circuit section 2 includes a resonant circuit having the secondary winding 20 and first circuit section 21, and a resonant circuit having the second circuit section 22, which is different from this resonant circuit.

Figure 5:
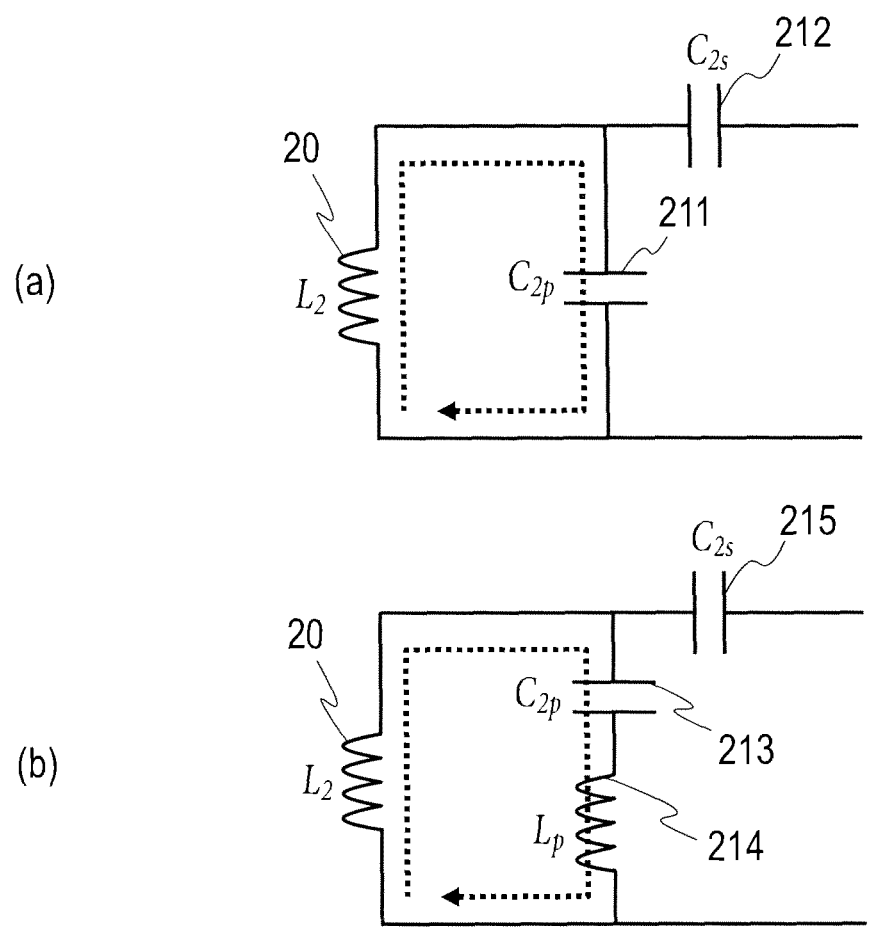
FIG. 5(a) illustrates a circuit diagram of a power reception circuit section according to a comparative example.
FIG. 5(b) illustrates a circuit diagram of a power reception circuit section of FIG. 1.

FIGS. 5(a) and 5(b) illustrate a circuit of a secondary side among circuits of FIG. 4, in which FIG. 5(a) illustrates a circuit diagram according to a comparative example, and FIG. 5(b) illustrates a circuit diagram according to the present example. As illustrated in FIG. 5(a), the power reception circuit section 2 of the non-contact power feeding apparatus according to the comparative example has a capacitor 211 provided as the first circuit section 21, and has a capacitor 212 provided as the second circuit section 22. That is, the power reception circuit section 2 according to the comparative example 1 is provided with: the secondary winding 20; the capacitor 211 connected in parallel to the secondary winding 20; and the capacitor 212 connected in series to a parallel circuit of the secondary winding 20 and the capacitor 211. An electric capacitance of the capacitor 211 is $C_{2p}$, and an electric capacitance of the capacitor 212 is $C_{2s}$.

As illustrated in FIG. 5(b), the power reception circuit section 2 of the non-contact power feeding apparatus according to the present example is provided with a series circuit of the capacitor 213 and a coil 214 as a first circuit element, and a capacitor 215 as the second circuit section 22. That is, the power reception circuit section 2 according to the present example is provided with: the secondary winding 20; the series circuit of the capacitor 213 and coil 214 which is connected in parallel to the secondary winding 20; and the capacitor 215 connected in series to the parallel circuit of the secondary winding 20 and this series circuit. An electric capacitance of the capacitor 213 is $C_{2p}$, an inductance of the coil 214 is $L_p$, and an electric capacitance of the capacitor 215 is $C_{2s}$.

An electric capacitance ($C_{2p}$) of the capacitor 213 according to the present example is the same as an electric capacitance ($C_{2p}$) of the capacitor 211 according to the comparative example, and an electric capacitance ($C_{2s}$) of the capacitor 215 according to the present example is the same as an electric capacitance ($C_{2s}$) of the capacitor 212 according to the comparative example. In addition, an inductance of the secondary winding 20 according to the present example is the same as an inductance of the secondary winding 20 according to the comparative example.

Here, in the non-contact power feeding section 5 illustrated in FIGS. 4, 5(a) and 5(b), an impedance $Z_2$ of only the secondary side and an impedance of the resonant circuit formed in the secondary side will be described. In the non-contact power feeding section 5 of FIG. 4, when a coupling coefficient (κ) is assumed to be zero, an impedance of only the secondary side seen from the load side (power reception side) becomes $Z_2$. In addition, in the circuit of the secondary side of FIG. 4, in the present example, the resonant circuit including the first circuit section 21 and the resonant circuit including the second circuit section 22 are formed.

A characteristic impedance of a resonator formed of the secondary winding 20 and first circuit section 21 in the present example is assumed to be $Z_a$, and a characteristic impedance of a resonator formed of the secondary winding 20 and first circuit section 21 in the comparative example is assumed to be $Z_b$. In addition, a characteristic impedance of a resonant circuit formed of the secondary winding 20 and a circuit element connected to the secondary winding 20 in parallel (circuit of a closed loop illustrated by an arrow of a dotted line of FIGS. 5(a) and 5(b)) is assumed to be $Z_{22}$ (that is, $Z_{22}=Z_a$ in the circuit of the present example, and $Z_{22}=Z_b$ in the circuit of the comparative example).

In the present example, in order to increase an output power to the load side, as a condition for an impedance illustrated in FIG. 4, a circuit parameter of each circuit section is set so that the impedance ($Z_p$) of the first circuit section 21 may become larger than the impedance ($Z_s$) of the second circuit section 22.

Furthermore in the present example, for increasing an output power to the load side larger than in the circuit of the comparative example, so that the characteristic impedance $Z_a$ of the resonant circuit ($Z_{22}$) of the present example may become larger than the characteristic impedance $Z_b$ of the resonant circuit ($Z_{22}$) of the comparative example, an impedance of the first circuit section 21 is set without changing an inductance ($L_2$) of the secondary winding 20.

Between the characteristic impedance $Z_a$ of the resonant circuit ($Z_{22}$) according to the present example and the characteristic, impedance $Z_b$ of the resonant circuit ($Z_{22}$) according to the comparative example, a relation of the following Formula (1) holds:

$$Z_a > Z_b \qquad \text{[Formula 1]}$$

In the comparative example, the characteristic impedance $Z_b$ of the resonant circuit ($Z_{22}$), and a resonant frequency ($f_{22}$) of the resonant circuit ($Z_{22}$) are expressed by Formula (2) and Formula (3) in the following:

$$Z_{22} = \sqrt{\frac{L_2}{C_{2p}}} \qquad \text{[Formula 2]}$$

$$f_{22} = \frac{1}{2\pi\sqrt{L_2 C_{2p}}} \qquad \text{[Formula 3]}$$

Formula (4) is derived by introducing Formula (3) into Formula (2):

$$Z_{22} = 2\pi f_{22} \cdot L_2 \qquad \text{[Formula 4]}$$

Then, by substituting Formula (4) for Formula (1), a conditional expression expressed by Formula (5) is derived:

$$Z_a > 2\pi f_{22} \cdot L_2 = \sqrt{\frac{L_2}{C_{2p}}} \qquad \text{[Formula 5]}$$

That is, in the present example, by setting an impedance of the first circuit element so as to satisfy the condition of Formula (5), the impedance ($Z_a$) of the resonant circuit of the present invention is made larger than the impedance ($Z_b$) of the resonant circuit of the comparative example.

In the present example, as illustrated in FIG. 5(b), connecting the coil 214 to the capacitor 213, while increasing the impedance ($Z_p$) of the first circuit section 21 larger than the impedance ($Z_s$) of the second circuit section 22, satisfies the condition of Formula (5). In addition, the impedance ($Z_{22}$) of the resonant circuit including the secondary winding 20, the capacitor 213 and the coil 214 is expressed by the following Formula (6):

$$Z_{22} = \sqrt{\frac{L_2 + L_p}{C_{2p}}} \qquad \text{[Formula 6]}$$

Thereby, in the present example, as compared with the resonant circuit ($Z_2 = Z_p$) illustrated in the comparative example, connecting the coil ($L_p$) 214 to the capacitor ($C_{2p}$) increases the impedance ($Z_{22} = Z_a$) by the inductance ($L_p$).

Then, furthermore, in the present example, increasing the impedance ($Z_p$) of the first circuit section 21 larger than the impedance ($Z_s$) of the second circuit section 22 allows an electric current which has flowed into the capacitor ($C_{2p}$) to flow more into the capacitor ($C_{2s}$) side as illustrated in FIGS. 6(a) and 6(b), thus enabling to increase an output power to the load side.

FIGS. 6(a) and 6(b) are circuit diagrams for describing an electric current flowing in the secondary side of the non-contact power feeding section 5, in which FIG. 6(a) illustrates a circuit diagram according to the comparative example, and FIG. 6(b) illustrates a circuit diagram according to the present example.

When an output of the high frequency power source 6 and a coupling coefficient are assumed to be the same values in the comparative example and the present example, electric currents (alternating current) flowing from the secondary winding 20 are assumed to be 10 A in both examples. In this case, in the comparative example, since the impedance of the resonant circuit of the secondary winding 20 and capacitor 211 is not large, an electric current of 4 A of an electric current of 10 A branches and flows into the capacitor 211, and a remaining electric current of 6 A flows into the capacitor 212. Then, an electric current of 6 A flows into the load section 7.

On the other hand, in the present example, since an impedance of the resonant circuit of the secondary winding 20, capacitor 213 and coil 214 is large, and an impedance of the first circuit section 21 is larger than an impedance of the second circuit section 22, an electric current of 2 A of an electric current of 10 A branches and flows into the capacitor 213 and coil 214, and an remaining electric current of 8 A flows into the capacitor 215. Then, an electric current of 8 A flows into the load section 7. Thereby, as compared with the comparative example, an electric current into the load section 7 can be increased in the present example. As the result, an electric power supplied to the secondary winding 20 from the primary winding 10 can be sent to the resonant circuit including the capacitor 215 ($C_{2s}$), and a supply power to the load section 7 can be increased.

Next, in the non-contact power feeding section 5 of the present example, the characteristic of the impedance ($Z_1$) of only the primary side and the characteristic of the impedance ($Z_2$) of only the secondary side will be described. FIG. 7 is a circuit diagram of the non-contact power feeding section 5 of the present example, and is a circuit diagram in the case where the secondary side of the circuit diagram illustrated in FIG. 4 is replaced by the circuit of FIG. 5(b). FIG. 8 is a circuit diagram for describing the impedance ($Z_1$) of only the primary side. FIG. 9 is a circuit diagram for describing the impedance ($Z_2$) of only the secondary side. Circuit diagrams of FIGS. 8 and 9 are circuit diagrams in the case where a coupling coefficient (κ) of the circuit of FIG. 7 is set to zero.

In the present example, in order to have the following characteristics, electric capacitance values of capacitors 11, 213 and 215 included in the circuit of the non-contact power feeding section 5, and inductance values of the primary winding 10, secondary winding 20 and coil 214 are set.

As illustrated in FIG. 8, in the non-contact power feeding section 5, while a coupling coefficient is assumed to be zero (κ=0), an impedance of only the primary side seen from the high frequency alternating-current power source section 6 side (power transmission side) is assumed to be $Z_1$. As illustrated in FIG. 9, in the non-contact power feeding section 5, while a coupling coefficient is assumed to be zero ($\kappa=0$), an impedance of only the secondary side seen from the load section 7 side (power reception side) is assumed to be $Z_2$. In addition, the frequency ($f_0$) is the frequency of the fundamental wave component of the high frequency alternating-current power source section 6.

In FIG. 10, a frequency-impedance ($Z_1$) characteristic of an absolute value of only the primary side is illustrated. The absolute value characteristic of the impedance ($Z_1$) takes a minimum value (valley) in the vicinity of the frequency ($f_0$) of the fundamental wave component of the high frequency alternating-current power source section 6. When a resonant frequency of the power transmission circuit section 1 is assumed to be $f_1$, the frequency ($f_0$) of the fundamental wave of the high frequency alternating-current power source section 6 and the frequency ($f_1$) are made to be adjusted so that the frequency ($f_1$) may be equal to or almost equal to the frequency ($f_0$).

In FIG. 11, a frequency-impedance ($Z_2$) characteristic of an absolute value of only the secondary side is illustrated. The absolute value characteristic of the impedance ($Z_2$) has the frequency ($f_0$) of the fundamental wave component of the high frequency alternating-current power source section 6 between the frequency ($f_{22}$) which is the nearest to the frequency ($f_0$) of the fundamental wave component of the high frequency alternating-current power source section 6 and at which the maximum value (mountain) is given and the frequency ($f_{21}$) which is the nearest to the frequency ($f_0$) of the fundamental wave component of the high frequency alternating-current power source section 6 and at which the minimum value (valley) is given. In other words, the absolute value characteristic of the impedance ($Z_2$) takes a minimum value at the frequency ($f_{21}$) and a maximum value at the frequency ($f_{22}$). Then, each frequency ($f_{21}$, $f_{22}$ and $f_0$) is made to be adjusted so that the frequency ($f_0$) may be located between the frequency ($f_{21}$) and the frequency ($f_{22}$). Note that, in an example of FIG. 11, the frequency ($f_0$) is set in the vicinity of the frequency ($f_{22}$).

Here, each resonant frequency ($f_1$, $f_{21}$ and $f_{22}$) is expressed by Formulas (7) to (9) in the following:

$$f_1 = \frac{1}{2\pi\sqrt{L_1 C_{1s}}}. \quad \text{[Formula 7]}$$

$$f_{21} = \frac{1}{2\pi}\sqrt{\frac{(L_2+L_p)C_{2p} + C_{2s}L_2 - \sqrt{(L_2+L_p)^2 C_{2p}^2 + 2C_{2p}C_{2s}L_2(L_2-L_p) + C_{2s}^2 L_2^2}}{2C_{2p}C_{2s}L_{2p}L_2}} \quad \text{[Formula 8]}$$

$$f_{22} = \frac{1}{2\pi\sqrt{C_{2p}(L_2+L_p)}} \quad \text{[Formula 9]}$$

In the present example, with respect to the frequency ($f_0$) of the fundamental wave component of the high frequency alternating-current power source section 6, parameters of each circuit element are set so as to satisfy the above conditions with respect to the impedance ($Z_1$) of only the primary side and the impedance ($Z_2$) of only the secondary side, and thereby increasing the impedance ($Z_{22}$) of the resonant circuit at the frequency ($f_0$) without spoiling robustness, and as the result, it becomes possible to increase an output current to the load section 7 side, and to increase an output voltage. Here, the robustness is the efficiency of an electric power supply in a non-contact manner with respect to a position deviation between the primary winding 10 and the secondary winding 20.

Next, a circuit analysis result when impedance characteristics as illustrated in FIGS. 10 and 11 are set is illustrated in FIGS. 12(a) to 12(e). In FIGS. 12(a) to 12(e), FIG. 12(a) is a graph illustrating an absolute value characteristic and a phase ($\phi$) characteristic of an input impedance ($Z_{in}$) of the non-contact power feeding section 5 with respect to a frequency when the load section 7 is seen from an output of the high frequency alternating-current power source section 6. A graph a of FIG. 12(a) indicates an impedance characteristic, and a graph b indicates a phase characteristic. FIG. 12(b) illustrates a frequency characteristic of an electric current ($I_1$) of the primary winding 10, and FIG. 12(c) illustrates a frequency characteristic of an electric current ($I_2$) of the secondary winding 20, and FIG. 12(d) illustrates a frequency characteristic of an electric current ($I_p$: hereinafter, referred to as a parallel current) flowing through the capacitor 213 and coil 214 which are connected in parallel to the secondary winding 20. A graph c of FIG. 12(d) illustrates a characteristic of the present example, and a graph d illustrates a characteristic of the comparative example. FIG. 12(e) is a graph illustrating a frequency characteristic of an electric current ($I_L$: hereinafter, referred to as a load current) flowing through the load section 7. A graph e of FIG. 12(e) indicates a characteristic of the present example, and a graph f indicates a characteristic of the comparative example.

Characteristics of FIGS. 12(a) to 12(e) illustrate characteristics of the present invention and the comparative example when a coupling coefficient of the primary winding 10 and secondary winding 20 is assumed to be a certain constant value, and an input voltage from the high frequency alternating-current power source section 6 is assumed to be constant. As illustrated in FIG. 12(a), a phase characteristic of the input impedance ($Z_{in}$) is flat in the vicinity of the frequency ($f_0$) of the fundamental wave component of the high frequency alternating-current power source section 6, and is point-symmetrical with the vicinity of the frequency ($f_0$) of this fundamental wave component in the center.

At this time, since a phase of the input impedance ($Z_{in}$) is nearly zero, a power factor of the supply power becomes one, and the non-contact power feeding section 5 can supply an electric power efficiently. Then, when a coupling coefficient ($\kappa$) changes with respect to the above constant value, a phase of the input impedance ($Z_{in}$) changes so as to rotate with the vicinity of the frequency ($f_0$) of the graph of FIG. 12(a) in the center. Therefore, since a phase of the input impedance ($Z_{in}$) does not change largely from zero, a feeding efficiency in the non-contact power feeding section 5 is suppressed from being decreased. Thereby, the present example can increase the robustness.

As illustrated in FIGS. 12(b) and 12(c), the electric current ($I_1$) of the primary winding 10 becomes the same electric current in the comparative example and the present invention, and the electric current ($I_2$) of the secondary winding 20 becomes the same electric current in the comparative example and the present invention.

As illustrated in FIG. 12(d), the parallel current ($I_p$) is smaller in the present example than in the comparative example. Then, in proportion to the parallel current ($I_p$) being made small, the load current) of the present example has become larger than the load current ($I_L$) of the comparative example. Thereby, with respect to the secondary current ($I_2$) which is the same between the comparative example and the present example, while the impedance ($Z_{22}=Z_a$) of the resonant circuit of the present invention is made larger than the impedance ($Z_{22}=Z_b$) of the resonant circuit of the comparative example, the impedance ($Z_p$) of the first circuit section 21 is made larger than the impedance ($Z_s$) of the second circuit section 22, and thereby, it can be confirmed that the load current ($I_L$) becomes large without the robustness being spoiled. Therefore, when an input power of the high frequency alternating-current power source section 6 is assumed to be constant, the present example can increase an output power to the load as compared with the comparative example.

A feeding efficiency and an output power to the load when a coupling coefficient changes will be described using FIGS. 13 and 14. FIG. 13 is a graph illustrating a characteristic of a feeding efficiency with respect to a coupling coefficient, and FIG. 14 illustrates a graph indicating characteristics of an output power with respect to a coupling coefficient. The graph of FIG. 13 is characteristics of the present example and the comparative example. The graph a of FIG. 14 indicates a characteristic of the present example, and the graph b indicates a characteristic of the comparative example.

A feeding efficiency with respect to a coupling coefficient ($\kappa$) indicates the same characteristic in the comparative example and present invention as illustrated in FIG. 13. Since a characteristic of the input impedance ($Z_{in}$) is the same characteristic in the present invention and the comparative example, an electric current of the primary winding 10 of the present invention becomes the same as an electric current of the primary winding 10 of the comparative example, and an electric current of the secondary winding 20 of the present invention becomes the same as an electric current of the secondary winding 20 of the comparative example (refer to FIGS. 12(b) and 12(c)). Then, since voltages of the comparative example and present invention are also the same voltage, a feeding efficiency has the same characteristic in the comparative example and the present invention.

On the other hand, an output power with respect to a coupling coefficient ($\kappa$) is larger in the present invention than in the comparative example as illustrated in FIG. 14. This is because an output power of the present invention becomes large since a relation where the impedance ($Z_{22}=Z_a$) of the resonant circuit of the present invention becomes larger than the impedance ($Z_{22}=Z_b$) of the resonant circuit of the comparative example holds in a total range of changing of a coupling coefficient.

Next, using FIG. 15, a magnitude of an output power according to the comparative example and a magnitude of an output power according to the present example when a coupling coefficient ($\kappa$) is made to be 0.6 and a coupling coefficient ($\kappa$) is made to be 0.1 are illustrated, respectively. When a position deviation between the primary winding 10 and the secondary winding 20 is small and the coupling coefficient is large (coupling coefficient ($\kappa$)=0.6), an output power of the present example is larger than an output power of the comparative example. In addition, also when a position deviation between the primary winding 10 and the secondary winding 20 is large and a coupling coefficient is small (coupling coefficient ($\kappa$)=0.1), an output power of the present example is larger than an output power of the comparative example.

In particular, from FIGS. 14 and 15, in a region where a coupling coefficient is small, the present invention can make twice or more output power outputted to the load section 7 as compared with the comparative example. Thereby, the non-contact power feeding apparatus of the present example, while suppressing decreasing in a feeding efficiency even when a coupling coefficient decreases, can increase an output power to the load section 7 as compared with the comparative example.

As mentioned above, the present example increases a magnitude of the impedance ($Z_p$) of the first circuit section 21 larger than a magnitude of the impedance ($Z_s$) of the second circuit section 22. Thereby, the present example, while suppressing decreasing in a feeding efficiency with respect to changing of a coupling coefficient, can increase an output power to the load section 7.

Incidentally, as a method to increase a magnitude of the impedance ($Z_p$) of the first circuit section 21 larger than a magnitude of the impedance ($Z_s$) of the second circuit section 22, connecting a new capacitor in place of the coil 214 is also considered in FIG. 5(b). However, when a relation of each resonant frequency ($f_1$, $f_{21}$ and $f_{23}$) illustrated in FIG. 11 does not hold by connecting a new capacitor to the capacitor 213, the robustness will be spoiled.

Therefore, in the present example, connecting the coil 214 to the capacitor 213 increases the impedance $Z_p$ of the first circuit section 21 larger than the impedance $Z_s$ of the second circuit section 22. Adding the coil 214 forms a new resonant circuit in the secondary side. However, in the impedance ($Z_2$) characteristic of only the secondary side, a resonant frequency of the resonant circuit including the coil 214 is formed at a position apart from resonant frequencies ($f_1$, $f_{21}$ and $f_{23}$) (refer to FIG. 21 and Formula (10) of a second embodiment). Therefore, as for the present example, connecting not a new capacitor but a resistor or the coil 214 to the capacitor 213, even when the impedance $Z_p$ of the first circuit section 21 is made larger than the impedance $Z_s$ of the second circuit section 22, enables to increase an output power to the load section 7 without spoiling the robustness.

In addition, as for the present example, a magnitude of the impedance ($Z_a$) of the resonant circuit of the secondary winding 20 and the first circuit element is larger than a magnitude of the impedance ($Z_b$) of the resonant circuit of the secondary winding 20 and the capacitor 211 according to the comparative example (a case where the capacitor 211 is connected to the same position in place of the first circuit section 21 which has the capacitor 213 and the coil 214, and the capacitor 212 is connected to the same position in place of the second circuit section 22 which has the capacitor 215). Thereby, the present example, while suppressing decreasing in a feeding efficiency with respect to changing of a coupling coefficient, can increase an output power to the load section 7 larger than the comparative example.

In addition, the present example sets circuit parameters of the power reception circuit section 5 so as to satisfy Formula (5). Thereby, since an electric current which flows into the secondary winding 20 can be made to branch more to the load-section 7 side, an output power to the load section 7 can be increased.

In addition, in the present example, a frequency-characteristic of the impedance ($Z_1$) of only the primary side has a minimum value in the vicinity of the frequency ($f_0$) of the fundamental wave component of the high frequency alternating-current power source section 6, and a frequency-characteristic of the impedance ($Z_2$) of only the secondary side has the frequency ($f_0$) between a frequency which is the nearest to the frequency ($f_0$) and at which a minimum value is given and a frequency which is the nearest to the frequency ($f_0$) and at which a maximum value is given. Thereby, since a change of a power factor is suppressed with respect to changing of a coupling coefficient, it is possible to increase an output power to the load section 7 while suppressing a decrease in a feeding efficiency.

In addition, in the circuit illustrated in FIG. 7 of the present example, a frequency at which a minimum value of the impedance ($Z_1$) of only the primary side is given satisfies the condition of the resonant frequency indicated by Formula (7), and a frequency at which a minimum value of the impedance ($Z_2$) of only the secondary side is given satisfies the condition of the resonant frequency indicated by Formula (8), and a frequency at which a maximum value of the impedance ($Z_2$) of only the secondary side is given satisfies the condition of the resonant frequency indicated by Formula (9). Thereby, by setting circuit parameters of the non-contact power feeding section 5 so as to satisfy these conditions, it is possible to increase an output power to the load section 7 while suppressing a decrease in a feeding efficiency even when a coupling coefficient decreases.

In addition, as for the present example, the first circuit section 21 forms the resonant circuit having the impedance ($Z_a$) by connecting the capacitor 213 and the coil 214 in series. In addition, the second circuit section 22 forms the resonant circuit different from the resonant circuit of the impedance ($Z_a$) by connecting the capacitor 215. Thereby, in proportion to the inductance ($L_p$) of the coil 214 connected additionally to the capacitor 213, an impedance of the resonant circuit of the secondary winding 20, capacitor 213 and coil 214 can be made large. As the result, it is possible to increase an output power to the load section 7 while suppressing a decrease in a feeding efficiency.

Note that, as a modification example of the present invention, a capacitor 12 may be connected in place of the capacitor 11 of FIG. 7 as illustrated in FIG. 16. FIG. 16 illustrates a circuit diagram of the non-contact power feeding section 5 of a non-contact power feeding apparatus according to the modification example. The power transmission circuit section 1 is provided with the primary winding 10, and the capacitor 12 connected in parallel to the primary winding 10. An electric capacitance of the capacitor 12 is $C_{1p}$.

Also in a modification example illustrated in FIG. 16, the impedance $Z_p$ of the first circuit section 21 is larger than the impedance $Z_s$ of the second circuit section 22. In addition, the characteristic impedance $Z_a$ of the resonant circuit ($Z_{22}$) of the secondary side is larger than the characteristic impedance $Z_b$ of the resonant circuit ($Z_{22}$) of the comparative example, and satisfies the condition of Formula (5).

In the circuit illustrated in FIG. 16, a frequency-impedance ($Z_1$) characteristic of an absolute value of only the primary side is illustrated in FIG. 17, and a frequency-impedance ($Z_2$) characteristic of an absolute value of only the secondary side is illustrated in FIG. 18.

The absolute value characteristic of the impedance ($Z_1$) takes a maximum value (mountain) in the vicinity of the frequency ($f_0$) of the fundamental wave component of the high frequency alternating-current power source section 6. When a resonant frequency of the power transmission circuit section 1 of the modification example is assumed to be $f_1$, the frequency ($f_0$) of the fundamental wave of the high frequency alternating-current power source section 6 and the frequency ($f_1$) are made to be adjusted so that the frequency ($f_1$) may be equal to or approximately equal to the frequency ($f_0$).

The absolute value characteristic of the impedance ($Z_2$) has the frequency ($f_0$) of the fundamental wave component of the high frequency alternating-current power source section 6 between the frequency ($f_{22}$) which is the nearest to the frequency ($f_0$) of the fundamental wave component of the high frequency alternating-current power source section 6 and at which the maximum value (mountain) is given and the frequency ($f_{21}$) which is the nearest to the frequency ($f_0$) of the fundamental wave component of the high frequency alternating-current power source section 6 and at which the minimum value (valley) is given. In other words, the absolute value characteristic of the impedance ($Z_2$) takes a minimum value at the frequency ($f_{21}$) and a maximum value at the frequency ($f_{22}$). Then, each frequency ($f_{21}$, $f_{22}$, and $f_0$) is made to be adjusted so that the frequency ($f_0$) may be located between the frequency ($f_{21}$) and the frequency ($f_{22}$). Note that, in an example of FIG. 18, the frequency ($f_0$) is set in the vicinity of the frequency ($f_{22}$).

Resonant frequencies ($f_1$, $f_{21}$ and $f_{22}$) are expressed by Formulas (7) to (9). However, the electric capacitance ($C_{1s}$) of Formula (7) is replaced by the electric capacitance ($C_{1p}$) of the capacitor 12.

In the non-contact power feeding apparatus according to the modification example, a frequency-impedance ($Z_1$) characteristic of only the primary side has a maximum value in the vicinity of the frequency ($f_0$) of the fundamental wave component of the high frequency alternating-current power source section 6, and a frequency-impedance ($Z_2$) characteristic of only the secondary side has the frequency ($f_0$) between a frequency which is the nearest to the frequency ($f_0$) and at which a minimum value is given and a frequency ($f_0$) which is the nearest to the frequency ($f_0$) and at which a maximum value is given. Thereby, since a change of a power factor is suppressed with respect to changing of a coupling coefficient, it is possible to increase an output power to the load section 7 while suppressing a decrease in a feeding efficiency.

In the non-contact power feeding apparatus according to the modification example, a frequency at which a maximum value of the impedance ($Z_1$) of only the primary side is given satisfies the condition of the resonant frequency indicated by Formula (7), and a frequency at which a minimum value of the impedance ($Z_2$) of only the secondary side is given satisfies the condition of the resonant frequency indicated by Formula (8), and a frequency at which a maximum value of the impedance ($Z_2$) of only the secondary side is given satisfies the condition of the resonant frequency indicated by Formula (9). Thereby, by setting circuit parameters of the non-contact power feeding section 5 so as to satisfy these conditions, it is possible to increase an output power to the load section 7 while suppressing a decrease in a feeding efficiency even when a coupling coefficient decreases.

Note that, in the circuit illustrated in FIG. 16, a choke coil etc. may be connected to the power transmission circuit section 1 so that the power transmission circuit section 1 may not be short-circuited by an output from the high frequency alternating-current power source section 6.

In addition, as another modification example of the present invention, a resistor 216 may be connected in place of the coil 214 of FIG. 7 as illustrated in FIG. 19. FIG. 19 illustrates a circuit diagram of the non-contact power feeding section 5 of a non-contact power feeding apparatus according to the modification example. The power reception circuit section 2 is provided with: the secondary winding 20; a series circuit of the capacitor 213 and resistor 216, which is connected in parallel to the secondary winding 20; and the capacitor 215 connected in series to the parallel circuit of the secondary winding 20 and this series circuit.

In addition, as a modification example of the present invention, a capacitor 12 may be connected in place of the capacitor 11 of FIG. 19 as illustrated in FIG. 20. FIG. 20 illustrates a circuit diagram of the non-contact power feeding section 5 of a non-contact power feeding apparatus according to the modification example.

Also in modification examples illustrated in FIGS. 19 and 20, the impedance $Z_p$ of the first circuit section 21 is larger than the impedance $Z_s$ of the second circuit section 22. In addition, the characteristic impedance $Z_a$ of the resonant circuit ($Z_{72}$) of the secondary side is larger than the characteristic impedance $Z_b$ of the resonant circuit ($Z_{22}$) of the comparative example, and satisfies the condition of Formula (5).

In addition, in the circuit illustrated in FIG. 19, a frequency-impedance ($Z_1$) characteristic of an absolute value of only the primary side takes a minimum value (valley) in the vicinity of the frequency ($f_0$) of the fundamental wave component of the high frequency alternating-current power source section 6. The frequency ($f_0$) is set in the vicinity of the resonant frequency ($f_1$) of the power transmission circuit section 1.

In addition, in the circuit illustrated in FIG. 20, a frequency-impedance ($Z_1$) characteristic of an absolute value of only the primary side takes a maximum value (mountain) in the vicinity of the frequency ($f_0$) of the fundamental wave component of the high frequency alternating-current power source section 6. The frequency ($f_0$) is set in the vicinity of the resonant frequency ($f_1$) of the power transmission circuit section 1.

In circuits illustrated in FIGS. 19 and 20, a frequency-impedance ($Z_1$) characteristic of an absolute value of only the secondary side has the frequency ($f_0$) of the fundamental wave component of the high frequency alternating-current power source section 6 between the frequency ($f_{22}$) which is the nearest to the frequency ($f_0$) of the fundamental wave component of the high frequency alternating-current power source section 6 and at which the maximum value (mountain) is given and the frequency ($f_{21}$) which is the nearest to the frequency ($f_0$) of the fundamental wave component of the high frequency alternating-current power source section 6 and at which the minimum value (valley) is given.

As mentioned above, as for the present example, the first circuit section 21 forms a resonant circuit having the impedance ($Z_a$) by the capacitor 213 and resistor 216 being connected in series. In addition, as the second circuit section 22, a different resonant circuit from the resonant circuit having the impedance ($Z_a$) is formed by the capacitor 215 being connected. Thereby, an impedance of the resonant circuit of the secondary winding 20, capacitor 213 and resistor 216 can be made large in proportion to a resistance (r) of the resistor 216 connected additionally to the capacitor 213. As the result, it is possible to increase an output power to the load section 7 while suppressing a decrease in a feeding efficiency.

Note that, in the present example and modification example mentioned above, since a relation between an impedance and admittance holds, the capacitor 213 and the coil 214 may be changed mutually, and the capacitor 213 and the resistor 216 may be changed mutually.

The above capacitors 211 and 213 correspond to "first capacitor" of the present invention, and capacitors 212 and 215 correspond to "second capacitor" of the present invention, and capacitors 11 and 12 correspond to "third capacitor" of the present invention.

Second Embodiment

A non-contact power feeding apparatus according to another embodiment of the invention will be described. Against the first embodiment mentioned above, the present example differs in that a magnitude of the impedance ($Z_2$) of only the secondary side is set in accordance with a resonant frequency ($f_{23}$). Since a circuit configuration of the non-contact inducing apparatus of the present example is the same as in the first embodiment mentioned above, descriptions thereof are quoted suitably.

In FIG. 21, a frequency-impedance ($Z_2$) characteristic of an absolute value of only the secondary side is illustrated. Note that, also in FIG. 11, similarly, a frequency-impedance ($Z_2$) characteristic of only the secondary side is illustrated, but, in FIG. 11, a characteristic in a part of frequency range including only resonant frequency ($f_{21}$ and $f_{22}$) is illustrated, and in FIG. 21, a characteristic in a frequency range where the resonant frequency ($f_{23}$) is added to the resonant frequencies ($f_{21}$ and $f_{22}$) is illustrated.

The frequency ($f_0$) of the fundamental wave component of the high frequency alternating-current power source section 6 is set between the frequency ($f_{21}$) and the frequency ($f_{22}$) in the same way as the first embodiment, and is set in the vicinity of the frequency ($f_{22}$) in an example of FIG. 21.

A frequency ($f_{23}$) is the resonant frequency of the power reception circuit section 2, and is a frequency of a minimum value which is the second nearest to the frequency ($f_0$) in the characteristics of an absolute value of the impedance ($Z_2$). As mentioned above, in the present example, a new resonant circuit is formed by the coil 214 being provided in the power reception circuit section 2. The frequency ($f_{23}$) is a resonant frequency which appears in the characteristic of the impedance ($Z_2$) by the coil 214 being provided.

The frequency ($f_{23}$) is expressed by Formula (10):

$$f_{23} = \frac{1}{2\pi}\sqrt{\frac{(L_2+L_p)C_{2p}+C_{2s}L_2+\sqrt{(L_2+L_p)^2C_{2p}^2+2C_{2p}C_{2s}L_2(L_2-L_p)+C_{2s}^2L_2^2}}{2C_{2p}C_{2s}L_{2p}L_2}}$$ [Formula 10]

Here, a relation between a rated output of the high frequency alternating-current power source section 6 and the impedance ($Z_2$) in the frequency ($f_0$) of the fundamental wave component of the high frequency alternating-current power source section 6 will be described. A rating is prescribed for the inverter 63, and in order to make an efficiency of the inverter 63 high, an impedance determined by a rated voltage and rated current of the high frequency alternating-current power source section 6 may be made to be matched with the impedance ($Z_c$) in the frequency ($f_0$) of the fundamental wave component of the high frequency alternating-current power source section 6.

With respect to a characteristic of the impedance ($Z_2$), when circuit parameters are set so that the frequency ($f_{23}$) may be brought close to the frequency ($f_{22}$), the impedance ($Z_2$) with respect to the frequency ($f_{22}$) becomes large, and when circuit parameters are set so that the frequency ($f_{23}$) may be kept away from the frequency ($f_{22}$), the impedance ($Z_2$) with respect to the frequency ($f_{22}$) becomes small.

In addition, in the present example, the frequency ($f_0$) of the fundamental wave component of the high frequency alternating-current power source section 6 is set in the vicinity of the frequency ($f_{22}$). Therefore, the present example adjusts the resonant frequency ($f_{23}$), and makes the impedance ($Z_c$) in the frequency ($f_0$) matched with an impedance based on the rating of the inverter 63 of the high frequency alternating-current power source section 6, and thereby, increases an efficiency of the inverter 63.

As mentioned above, in the present example, a magnitude of the impedance ($Z_2$) with respect to the resonant frequency ($f_{22}$) of the resonant circuit of the secondary winding 20 and the first circuit section 21 which has the capacitor 213 and the coil 214 is set in accordance with the frequency ($f_{23}$). Thereby, the frequency ($f_0$) of the fundamental wave component of the high frequency alternating-current power source section 6 is made to be in agreement with the frequency ($f_{22}$), and while the frequency ($f_{23}$) is adjusted, an impedance based on the rating of the inverter 63 is made to be matched with the impedance ($Z_c$) with respect to the frequency ($f_{22}$), and thereby, it is possible to increase an efficiency of the inverter 63, and therefore, it is possible to increase an output power to the load section 7 while suppressing a decrease in a feeding efficiency.

REFERENCE SIGNS LIST 1 power transmission circuit section
10 primary winding
11, 12 capacitor
2 power reception circuit section
20 secondary winding
21 first circuit section
22 second circuit section
211, 212, 213, 215 capacitor
214 coil
215 capacitor
216 resistor
5 non-contact power feeding section
6 high frequency alternating-current power source section
61 rectifier
61a to 61f diode
62 smoothing capacitor
63 voltage type inverter
63a to 63d transistor
64 three-phase alternating-current power source
7 load section
71 rectifying section
71a to 71d diode
72 load

The invention claimed is:

1. A non-contact power feeding apparatus, comprising:
a secondary winding to which an electric power is supplied from a primary winding in a non-contact manner by an alternating-current power source;
a first circuit section connected in parallel to the secondary winding and configured to form a first resonant circuit with the secondary winding; and
a second circuit section connected in series to a parallel circuit of the secondary winding and the first circuit section and configured to form a second resonant circuit with the secondary winding different from the first resonant circuit, wherein
the second circuit section includes a battery,
a magnitude of an impedance of the first circuit section is larger than a magnitude of an impedance of the second circuit section,
wherein the first circuit section includes a first capacitor, and
the second circuit section includes a second capacitor, and wherein $$Z_a > \sqrt{\frac{L_2}{C_{2p}}}$$

is satisfied,
where,
$Z_a$ denotes an impedance of the first resonant circuit of the secondary winding and the first circuit section,
$C_{2p}$ denotes an electric capacitance of the first capacitor, and
$L_2$ denotes an inductance of the secondary winding.

2. The non-contact power feeding apparatus according to claim 1, wherein
a frequency-impedance characteristic of $Z_1$ has a minimum value or a maximum value in the vicinity of a frequency of a fundamental wave component of the alternating-current power source, and
a frequency-impedance characteristic of $Z_2$ has the frequency of the fundamental wave component between a frequency which is nearest to the frequency of the fundamental wave component and at which a minimum value is given and a frequency which is nearest to a frequency of the fundamental wave component and at which a maximum value is given,
where
$Z_1$ denotes an impedance of only a primary side seen from an output side of the alternating-current power source when a coupling coefficient between the primary winding and the secondary winding is zero, and
$Z_2$ denotes an impedance of only a secondary side seen from a load side connected to the secondary winding when a coupling coefficient between the primary winding and the secondary winding is zero.

3. The non-contact power feeding apparatus according to claim 2, further comprising:
a third capacitor connected in series or in parallel to the primary winding,
wherein
the first circuit section has a series circuit of the first capacitor and a coil, and
the second circuit section has the second capacitor, and wherein
a frequency at which a minimum value or a maximum value of the $Z_1$ is given satisfies:

$$f_1 = \frac{1}{2\pi\sqrt{L_1 C_1}}$$

a frequency at which a minimum value of the $Z_2$ is given satisfies:

$$f_{21} = \frac{1}{2\pi}\sqrt{\frac{(L_2+L_p)C_{2p}+C_{2s}L_2 - \sqrt{(L_2+L_p)^2 C_{2p}^2 + 2C_{2p}C_{2s}L_2(L_2-L_p)+C_{2s}^2 L_2^2}}{2C_{2p}C_{2s}L_p L_2}}$$

and
a frequency at which a maximum value of the $Z_2$ is given satisfies:

$$f_{22} = \frac{1}{2\pi\sqrt{C_{2p}(L_2+L_p)}}$$

where
$f_1$ denotes a frequency of a minimum value or maximum value of the $Z_1$;

$f_{21}$ denotes a frequency of a minimum value of the $Z_2$ nearest to a frequency of the fundamental wave component;

$f_{22}$ denotes a frequency of a maximum value of the $Z_2$ nearest to a frequency of the fundamental wave component;

$C_1$ denotes an electric capacitance of the third capacitor;

$L_1$ denotes an inductance of the primary winding;

$C_{2p}$ denotes an electric capacitance of the first capacitor;

$C_{2s}$ denotes an electric capacitance of the second capacitor;

$L_p$ denotes an inductance of the coil; and $L_2$ denotes an inductance of the secondary winding.

4. The non-contact power feeding apparatus according to claim 2, wherein a magnitude of the $Z_2$ with respect to a resonant frequency of the first resonant circuit of the secondary winding and the first circuit section is set in accordance with a frequency which is the second nearest to the frequency of the fundamental wave component among two or more frequencies at which a minimum value is given in the impedance characteristic of the $Z_2$.

5. The non-contact power feeding apparatus according to claim 1, wherein the first circuit section has a series circuit of the first capacitor and a coil, and the second circuit section has the second capacitor.

6. The non-contact power feeding apparatus according to claim 1, wherein the first circuit section has a series circuit of the first capacitor and a resistor, and the second circuit section has the second capacitor.

* * * * *